(12) United States Patent
Choi et al.

(10) Patent No.: US 12,224,295 B2
(45) Date of Patent: Feb. 11, 2025

(54) IMAGE SENSOR AND METHOD OF MANUFACTURING THE SAME

(71) Applicant: SAMSUNG ELECTRONICS CO., LTD., Suwon-si (KR)

(72) Inventors: Hakyu Choi, Yongin-si (KR); Yongsuk Choi, Suwon-si (KR); Keo-Sung Park, Seongnam-si (KR); Dongwook Won, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 17/455,246

(22) Filed: Nov. 17, 2021

(65) Prior Publication Data
US 2022/0293649 A1    Sep. 15, 2022

(30) Foreign Application Priority Data
Mar. 10, 2021    (KR) .................. 10-2021-0031492

(51) Int. Cl.
*H01L 27/146*    (2006.01)
(52) U.S. Cl.
CPC .. *H01L 27/14614* (2013.01); *H01L 27/14621* (2013.01); *H01L 27/14627* (2013.01); *H01L 27/1463* (2013.01); *H01L 27/14636* (2013.01); *H01L 27/1464* (2013.01); *H01L 27/14645* (2013.01); *H01L 27/14689* (2013.01)
(58) Field of Classification Search
CPC ......... H01L 27/14614; H01L 27/14621; H01L 27/14627; H01L 27/1463; H01L 27/14636; H01L 27/1464; H01L 27/14645; H01L 27/14689
See application file for complete search history.

(56) References Cited

U.S. PATENT DOCUMENTS

| 7,098,067 B2 | 8/2006 | Adkisson et al. |
| 7,232,712 B2 | 6/2007 | Han |

(Continued)

FOREIGN PATENT DOCUMENTS

| KR | 10-0247170 | 12/1999 |
| KR | 1020100044996 | 5/2010 |
| KR | 1020100138325 | 12/2010 |

*Primary Examiner* — Monica D Harrison
*Assistant Examiner* — Andre C Stevenson
(74) *Attorney, Agent, or Firm* — F. Chau & Associates, LLC

(57) ABSTRACT

A method of manufacturing an image sensor includes forming a first dopant region having a second conductivity type in a semiconductor substrate including first and second surfaces. The semiconductor substrate has a first conductivity type different from the second conductivity type. The method further includes forming a pixel isolation structure defining pixel regions in the semiconductor substrate, forming a vertical trench by patterning the first surface in each of the pixel regions, forming a mask pattern exposing each of the pixel regions on the first surface, in which the mask pattern includes a residual mask pattern filling at least a portion of the vertical trench, forming a second dopant region having the second conductivity type in the semiconductor substrate by using the mask pattern as an ion-implantation mask, in which the second dopant region is adjacent to the vertical trench, and forming a transfer gate electrode in the vertical trench.

12 Claims, 19 Drawing Sheets

(56) References Cited

U.S. PATENT DOCUMENTS

2007/0075221 A1* 4/2007 Park .................... H01L 27/1463
                                                    250/214.1
2018/0182806 A1* 6/2018 Jin ..................... H01L 27/14685

* cited by examiner

IMAGE SENSOR AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2021-0031492, filed on Mar. 10, 2021 in the Korean Intellectual Property Office, the disclosure of which is hereby incorporated by reference in its entirety.

TECHNICAL FIELD

Embodiments of the inventive concept relate to an image sensor and a method of manufacturing the same, and more particularly, to an image sensor with improved electrical characteristics and a method of manufacturing the same.

DISCUSSION OF RELATED ART

An image sensor may convert an optical image into an electrical signal. As computer and communication industries advance, high-performance image sensors have been increasingly in demand in various fields relating to, for example, a digital camera, a camcorder, a personal communication system (PCS), a game console, a security camera, and a medical micro camera.

Image sensors may be categorized as charge coupled device (CCD) image sensors and complementary metal-oxide-semiconductor (CMOS) image sensors. The CMOS image sensor may be efficiently driven, and may be implemented as a single chip on which a signal processing circuit and an image sensing part are integrated. Thus, the size of the CMOS image sensor may be reduced. Moreover, the CMOS image sensor may have low power consumption, and thus, may be utilized in a product having a limited battery capacity. Furthermore, the CMOS image sensor may be manufactured using a CMOS process technique, thereby reducing a manufacturing cost of the CMOS image sensor. Furthermore, the CMOS image sensor may have high resolution. Accordingly, the CMOS image sensor is widely used in various fields.

SUMMARY

Embodiments of the inventive concept provide an image sensor with improved electrical characteristics and a method of manufacturing the same.

According to an embodiment of the inventive concept, a method of manufacturing an image sensor includes forming a first dopant region having a second conductivity type in a semiconductor substrate, in which the semiconductor substrate includes a first surface and a second surface opposite to the first surface, and in which the semiconductor substrate has a first conductivity type different from the second conductivity type. The method further includes forming a pixel isolation structure defining a plurality of pixel regions in the semiconductor substrate, forming a vertical trench by patterning the first surface of the semiconductor substrate in each of the pixel regions, and forming a mask pattern exposing each of the pixel regions on the first surface of the semiconductor substrate, in which the mask pattern includes a residual mask pattern filling at least a portion of the vertical trench. The method further includes forming a second dopant region by ion-implanting dopants having the second conductivity type into the semiconductor substrate by using the mask pattern as an ion-implantation mask, in which the second dopant region is adjacent to the vertical trench, and forming a transfer gate electrode in the vertical trench, in which a gate insulating layer is interposed between the transfer gate electrode and an inner surface of the vertical trench.

According to an embodiment of the inventive concept, an image sensor includes a semiconductor substrate including a first surface and a second surface opposite to the first surface, in which the semiconductor substrate has a first conductivity type. The image sensor further includes a pixel isolation structure disposed in the semiconductor substrate and defining a plurality of pixel regions, a plurality of photoelectric conversion regions respectively disposed in the pixel regions and including dopants having a second conductivity type different from the first conductivity type, and a transfer gate electrode disposed in a vertical trench formed in the first surface of the semiconductor substrate. Each of the photoelectric conversion regions includes a first dopant region adjacent to the second surface of the semiconductor substrate, and a second dopant region disposed around the transfer gate electrode. The second dopant region includes a first region adjacent to a sidewall of the vertical trench, and a second region adjacent to a bottom surface of the vertical trench. A vertical thickness of the second region of the second dopant region is less than a vertical thickness of the first region of the second dopant region.

BRIEF DESCRIPTION OF THE DRAWINGS

The above and other features of the inventive concept will become more apparent by describing in detail embodiments thereof with reference to the accompanying drawings, in which.

DETAILED DESCRIPTION OF THE EMBODIMENTS

Figure 1:
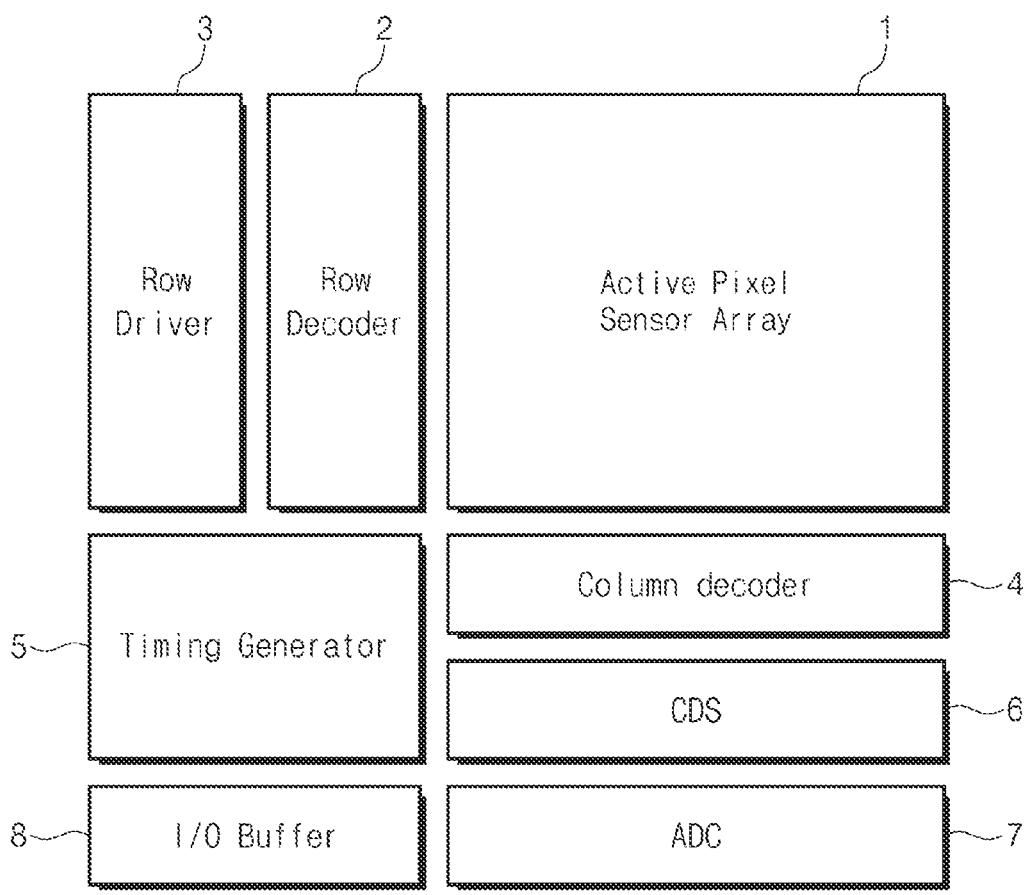
FIG. 1 is a schematic block diagram illustrating an image sensor according to some embodiments of the inventive concept.

Embodiments of the inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to embodiments, the parameter may be exactly the certain value or approximately the certain value within a measurement error as would be understood by a person having ordinary skill in the art. Other uses of these terms and similar terms to describe the relationships between components should be interpreted in a like fashion.

As is traditional in the field of the inventive concept, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

An image sensor and a method of manufacturing the same according to some embodiments of the inventive concept will be described more fully hereinafter with reference to the accompanying drawings.

FIG. 1 is a schematic block diagram illustrating an image sensor according to some embodiments of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels two-dimensionally arranged and may convert optical signals into electrical signals. The active pixel sensor array 1 may be driven by a plurality of driving signals (e.g., a pixel selection signal, a reset signal, and a charge transfer signal) provided from the row driver 3. In addition, the converted electrical signals may be provided to the correlated double sampler 6.

The row driver 3 may provide a plurality of driving signals for driving a plurality of the unit pixels to the active pixel sensor array 1 in response to signals decoded in the row decoder 2. When the unit pixels are arranged in a matrix form, the driving signals may be provided in the unit of a row of the matrix.

The timing generator 5 may provide timing signals and control signals to the row decoder 2 and the column decoder 4.

The correlated double sampler 6 may receive electrical signals generated by the active pixel sensor array 1 and may hold and sample the received electrical signals. The correlated double sampler 6 may doubly sample a specific noise level and a signal level of the electrical signal and may output a difference level corresponding to a difference between the noise level and the signal level.

The analog-to-digital converter 7 may convert an analog signal, which corresponds to the difference level outputted from the correlated double sampler 6, into a digital signal. The analog-to-digital converter 7 may output the digital signal.

The I/O buffer 8 may latch the digital signals and may sequentially output the latched digital signals to an image signal processing unit in response to signals decoded in the column decoder 4.

Figure 2A:
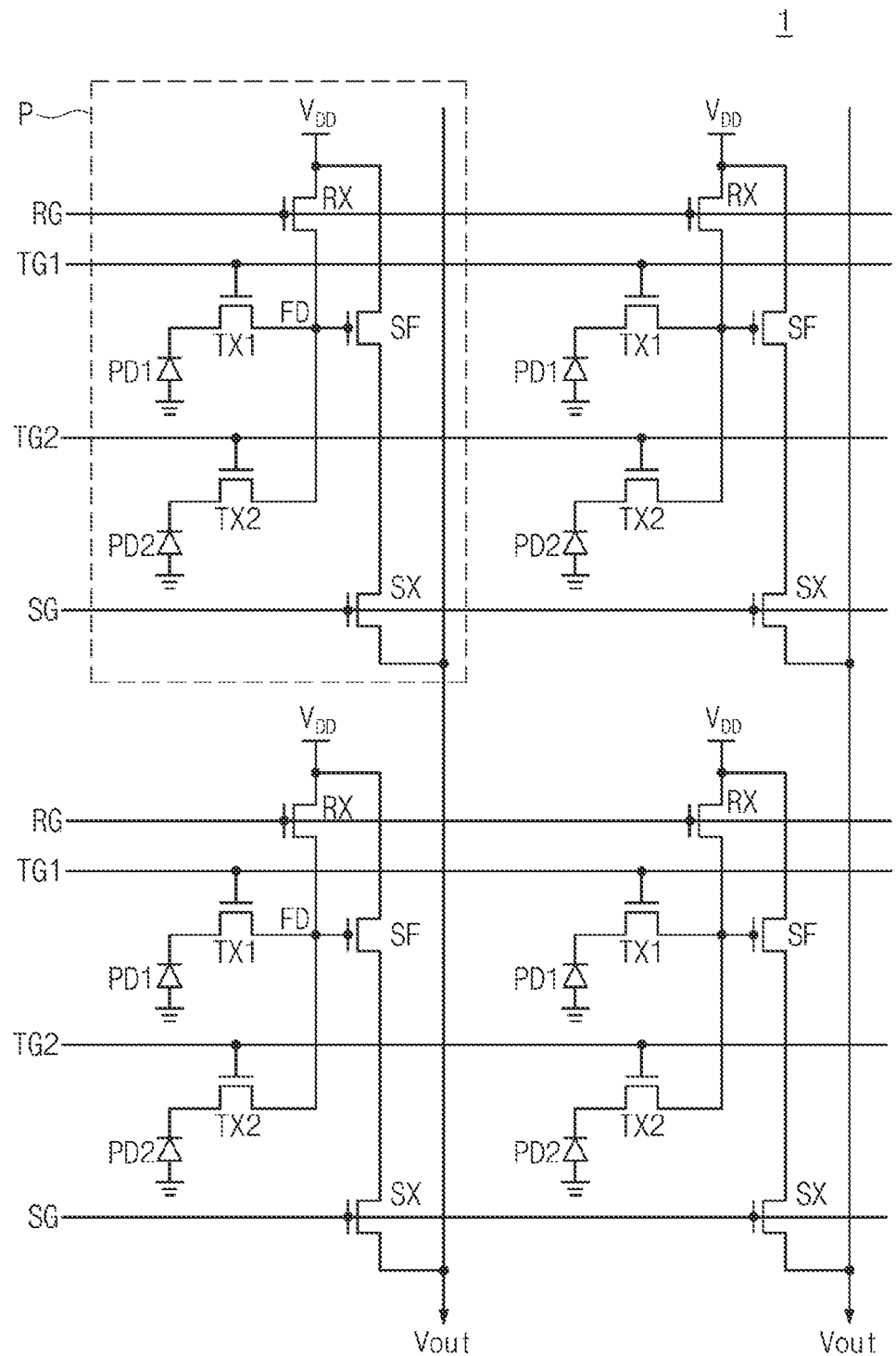
FIGS. 2A and 2B are circuit diagrams illustrating active pixel sensor arrays of image sensors according to some embodiments of the inventive concept.
Figure 2B:
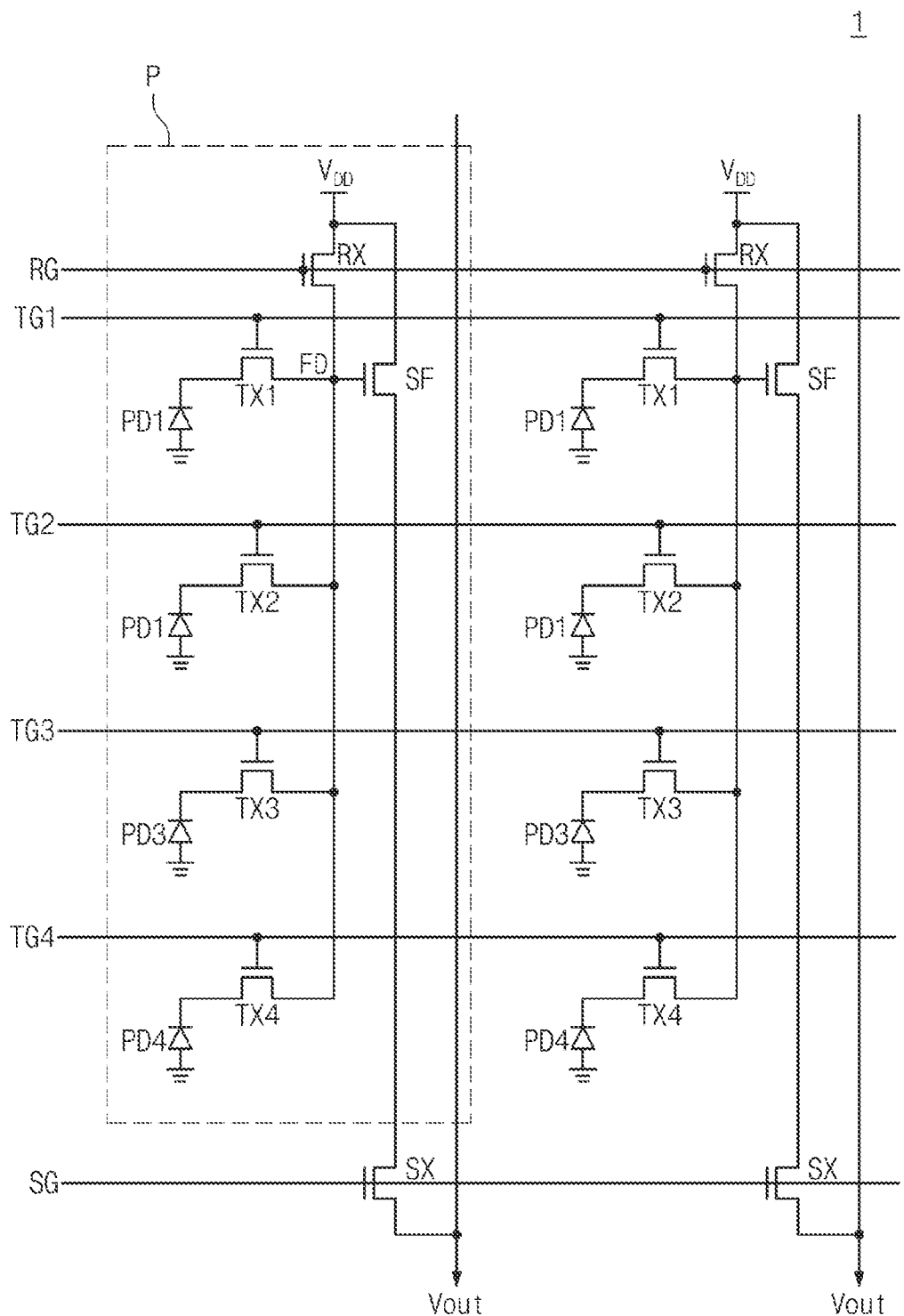

FIGS. 2A and 2B are circuit diagrams illustrating active pixel sensor arrays of image sensors according to some embodiments of the inventive concept.

Referring to FIG. 2A, the active pixel sensor array 1 may include a plurality of unit pixels P. The unit pixels P may be arranged in a matrix form along a row direction and a column direction. The unit pixel P may include first and second photoelectric conversion elements PD1 and PD2, first and second transfer transistors TX1 and TX2, and logic transistors RX, SX and SF. The logic transistors RX, SX and SF may include a reset transistor RX, a selection transistor SX, and a source follower transistor SF. Gate electrodes of the first and second transfer transistors TX1 and TX2, a gate electrode of the reset transistor RX, and a gate electrode of the selection transistor SX may be connected to driving signal lines TG1, TG2, RG and SG, respectively.

As described above, a plurality of unit pixels P is illustrated in FIG. 2A. According to some embodiments, the plurality of unit pixels P may have the same structure and configuration as one another. Thus, for convenience of explanation, only one of the unit pixels P of FIG. 2A is described in detail herein.

The first transfer transistor TX1 may include a first transfer gate electrode and the first photoelectric conversion element PD1, and the second transfer transistor TX2 may include a second transfer gate electrode and the second photoelectric conversion element PD2. In addition, the first and second transfer transistors TX1 and TX2 may share a charge detection node (e.g., a floating diffusion region) FD.

The first and second photoelectric conversion elements PD1 and PD2 may generate and accumulate photocharges in proportion to the amount of light incident from outside of the image sensor. Each of the first and second photoelectric conversion elements PD1 and PD2 may include a photodiode, a photo transistor, a photo gate, a pinned photodiode (PPD), or any combination thereof.

The first and second transfer gate electrodes may transfer charges, which are accumulated in the first and second photoelectric conversion elements PD1 and PD2, into the charge detection node (e.g., the floating diffusion region) FD. Signals which are complementary to each other may be applied to the first and second transfer gate electrodes. In other words, charges may be transferred from one of the first and second photoelectric conversion elements PD1 and PD2 into the charge detection node FD.

The charge detection node FD may receive the charges generated in the first and second photoelectric conversion elements PD1 and PD2 and may cumulatively store the received charges. The source follower transistor SF may be controlled according to the amount of the photocharges accumulated in the charge detection node FD.

The reset transistor RX may periodically reset the charges accumulated in the charge detection node FD. For example, a drain electrode of the reset transistor RX may be connected to the charge detection node FD, and a source electrode of the reset transistor RX may be connected to a power voltage $V_{DD}$. When the reset transistor RX is turned on, the power voltage $V_{DD}$ connected to the source electrode of the reset transistor RX may be transmitted to the charge detection node FD. Thus, the charges accumulated in the charge detection node FD may be discharged to reset the charge detection node FD when the reset transistor RX is turned on.

The source follower transistor SF may amplify a change in potential of the charge detection node FD and may output the amplified signal (e.g., a pixel signal) to an output line Vout through the selection transistor SX. The source follower transistor SF may be a source follower buffer amplifier that generates a source-drain current in proportion to the amount of the photocharges provided to a gate electrode thereof. The gate electrode of the source follower transistor SF may be connected to the charge detection node FD, a drain electrode of the source follower transistor SF may be connected to the power voltage $V_{DD}$, and a source electrode of the source follower transistor SF may be connected to a drain electrode of the selection transistor SX.

The selection transistor SX may select the unit pixels P to be sensed in the unit of a row. When the selection transistor SX is turned on, the power voltage $V_{DD}$ connected to the drain electrode of the source follower transistor SF may be transmitted to the drain electrode of the selection transistor SX.

Referring to FIG. 2B, in some embodiments, the active pixel sensor array 1 may include a plurality of unit pixels P, and each of the unit pixels P may include four transfer transistors TX1, TX2, TX3 and TX4. The four transfer transistors TX1, TX2, TX3 and TX4 may share the charge detection node FD and the logic transistors RX, SX and SF.

In some embodiments, the unit pixels P to be sensed in the unit of a row may be selected by a selection signal. Charges may be transferred from one of first to fourth photoelectric conversion elements PD1, PD2, PD3 and PD4 into the charge detection node FD in response to signals applied to first to fourth charge transfer signal lines TG1, TG2, TG3 and TG4.

As described above, a plurality of unit pixels P is illustrated in FIG. 2B. According to some embodiments, the plurality of unit pixels P may have the same structure and configuration as one another. Thus, for convenience of explanation, only one of the unit pixels P of FIG. 2B is described in detail herein.

Figure 3:
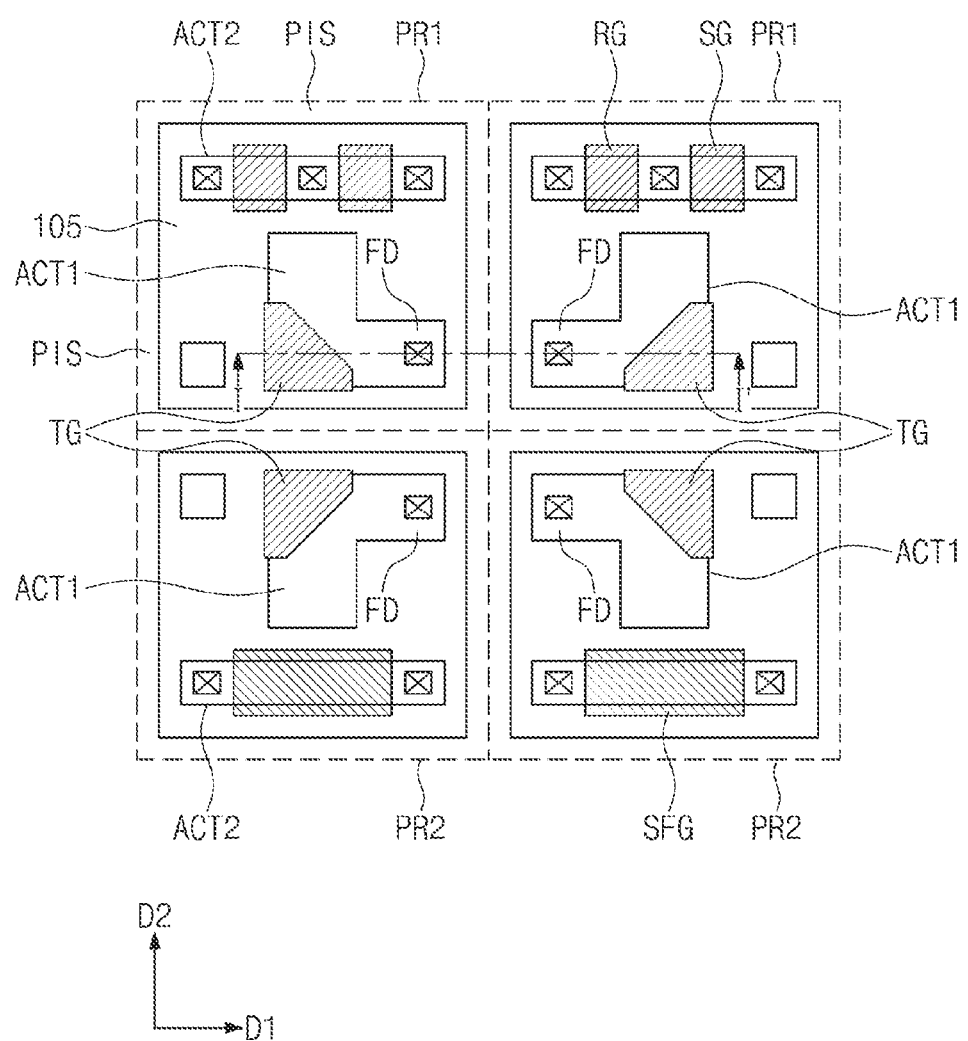
FIG. 3 is a plan view illustrating an image sensor according to some embodiments of the inventive concept.

FIG. 3 is a plan view illustrating an image sensor according to some embodiments of the inventive concept. FIGS. 4 to 8, 9A, 9B, 9C, 10, 11 and 12 are cross-sectional views taken along line I-I' of FIG. 3 illustrating a method of manufacturing an image sensor, according to some embodiments of the inventive concept.

Figure 4:
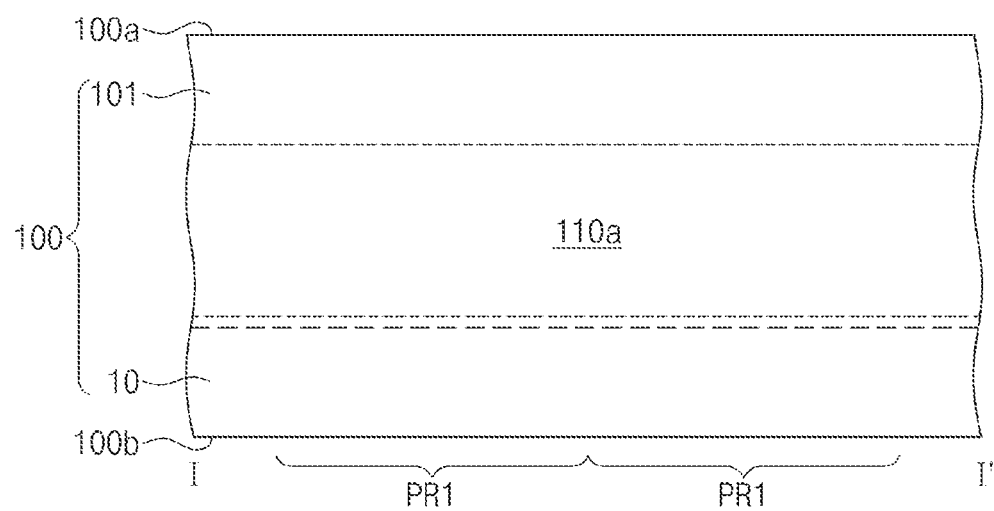
FIGS. 4 to 8, 9A, 9B, 9C, 10, 11 and 12 are cross-sectional views taken along line I-I' of FIG. 3 illustrating a method of manufacturing an image sensor, according to some embodiments of the inventive concept.

Referring to FIGS. 3 and 4, a semiconductor substrate 100 having a first conductivity type (e.g., a P-type) may be provided. The semiconductor substrate 100 may have a first surface 100a and a second surface 100b which are opposite to each other. The semiconductor substrate 100 may include an epitaxial layer 101, which has the first conductivity type and is formed on a bulk silicon substrate 10 having the first conductivity type.

Alternatively, the semiconductor substrate 100 may be a bulk semiconductor substrate including a well having the first conductivity type. In some embodiments, the semiconductor substrate 100 may be a silicon-on-insulator (SOI) substrate, a germanium substrate, a germanium-on-insulator (GOI) substrate, or a silicon-germanium (SiGe) substrate. However, the semiconductor substrate 100 is not limited thereto.

The epitaxial layer 101 may be formed by performing a selective epitaxial growth (SEG) process using the bulk silicon substrate 10 as a seed, and may be doped with dopants having the first conductivity type during the SEG process. For example, the epitaxial layer 101 may include P-type dopants.

Next, a first dopant region 110a having a second conductivity type may be formed in the epitaxial layer 101.

The first dopant region 110a may be formed by doping a portion of the epitaxial layer 101 with dopants having the second conductivity type (e.g., an N-type) different from the first conductivity type. The first dopant region 110a may be spaced apart from the first surface 100a and the second surface 100b of the semiconductor substrate 100. The first dopant region 110a may be a well dopant region having the second conductivity type, which is formed in the epitaxial layer 101.

Figure 5:
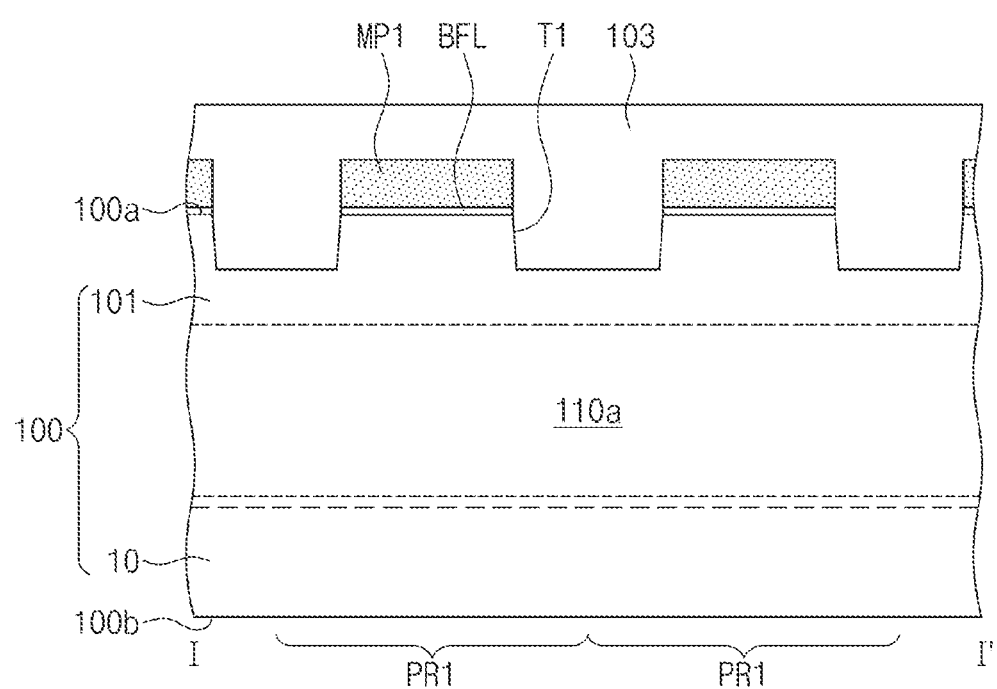

Referring to FIGS. 3 and 5, a first trench T1 may be formed by patterning the first surface 100a of the semiconductor substrate 100. The first trench T1 may define first and second active portions ACT1 and ACT2 in each of pixel regions PR1 and PR2. A buffer layer BFL and a first mask pattern MP1 may be sequentially formed on the first surface 100a of the semiconductor substrate 100, and the semiconductor substrate 100 may be anisotropically etched using the first mask pattern MP1 as an etch mask to form the first trench T1.

The buffer layer BFL may be formed by performing a deposition process or a thermal oxidation process on the first surface 100a of the semiconductor substrate 100. The buffer layer BFL may include, for example, a silicon oxide layer.

For example, the first mask pattern MP1 may include silicon nitride or silicon oxynitride. A bottom surface of the first trench T1 may be spaced apart from the first dopant region 110a.

In some embodiments, the first trench T1 is formed after the formation of the first dopant region 110a. Alternatively, the first trench T1 may be formed before the formation of the first dopant region 110a.

Next, a filling insulation layer 103 may be formed to fill the first trench T1. The filling insulation layer 103 may be formed by depositing an insulating material having a large thickness on the semiconductor substrate 100 having the first trench T1. The filling insulation layer 103 may fill the first trench T1 and may cover the first mask pattern MP1.

Figure 6:
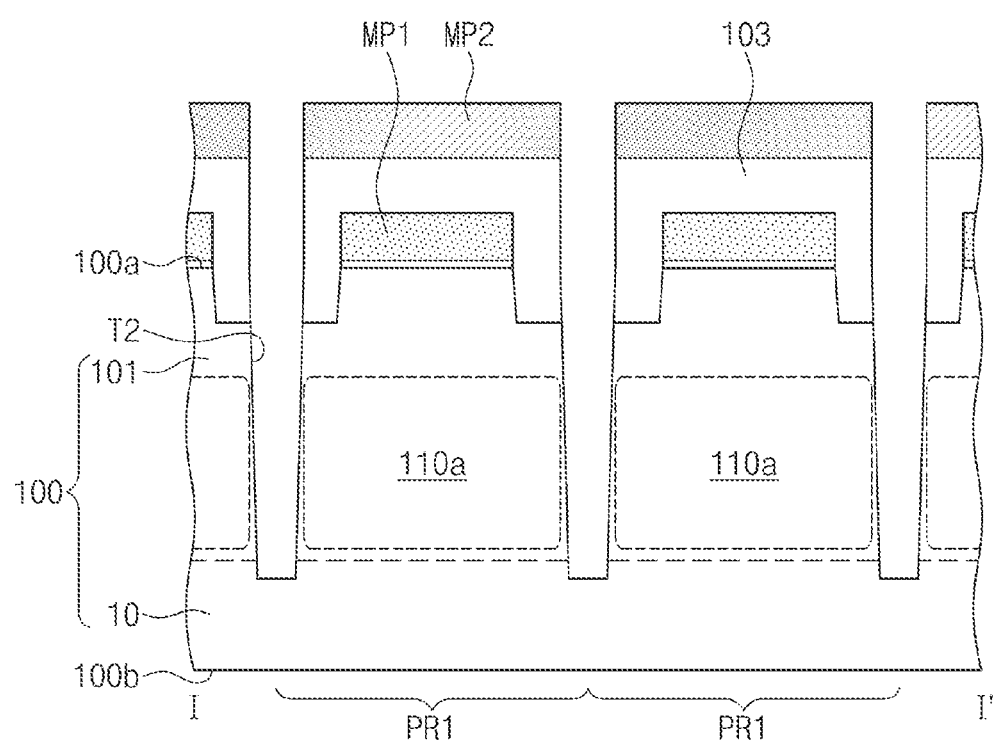

Referring to FIGS. 3 and 6, a second trench T2 may be formed. The second trench T2 may define pixel regions PR1 and PR2. The second trench T2 may be formed by patterning the filling insulation layer 103 and the first surface 100a of the semiconductor substrate 100. A plurality of first and second pixel regions PR1 and PR2 may be arranged in a matrix form along first and second directions D1 and D2 intersecting each other.

For example, a second mask pattern MP2 may be formed on the filling insulation layer 103, and the filling insulation layer 103 and the semiconductor substrate 100 may be anisotropically etched using the second mask pattern MP2 as an etch mask to form the second trench T2.

The second trench T2 may vertically extend from the first surface 100a toward the second surface 100b of the semiconductor substrate 100 to expose an inner sidewall of the epitaxial layer 101 and a portion of the bulk silicon substrate 10. The second trench T2 may be deeper than the first trench T1 and may penetrate a portion of the first trench T1. That is, the depth of the second trench T2 may be greater than the depth of the first trench T1 in some embodiments.

The second trench T2 may include a plurality of first regions extending in the first direction D1 and having uniform widths, and a plurality of second regions extending in the second direction D2 intersecting the first direction D1 and having uniform widths, when viewed in a plan view.

The second trench T2 may be formed by performing the anisotropic etching process, and thus, a width of the second trench T2 may become progressively less from the first surface 100a toward the second surface 100b of the semiconductor substrate 100. In other words, the second trench T2 may have an inclined sidewall. A bottom surface of the second trench T2 may be spaced apart from the second surface 100b of the semiconductor substrate 100.

The first dopant region 110a may be divided into a plurality of first dopant regions 110a by the formation of the second trench T2. The first dopant regions 110a may be provided in the pixel regions PR1 and PR2, respectively. The second mask pattern MP2 may be removed after the formation of the second trench T2.

In addition, a barrier region including dopants having the first conductivity type may be formed along an inner sidewall of the second trench T2 after the formation of the second trench T2. For example, the barrier region may include P-type dopants.

Figure 7:
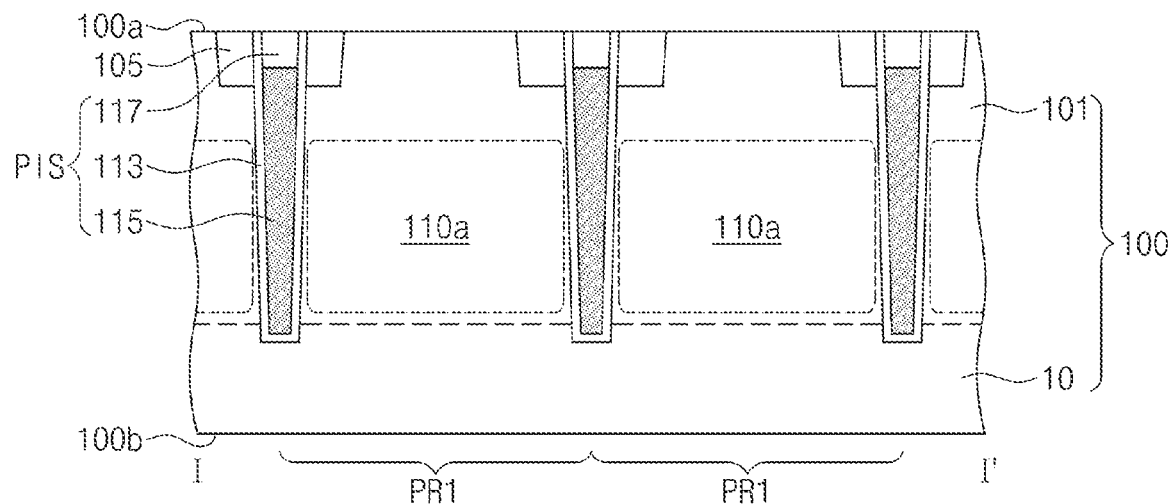

Referring to FIGS. 3 and 7, a pixel isolation structure PIS may be formed in the second trench T2. The pixel isolation structure PIS may include a liner insulating pattern 113, a semiconductor pattern 115, and a capping insulating pattern 117.

The formation of the pixel isolation structure PIS may include forming a liner insulating layer conformally covering an inner surface of the second trench T2, depositing a semiconductor layer filling the second trench T2 having the liner insulating layer, forming the semiconductor pattern 115 in the second trench T2 having the liner insulating layer by recessing a top surface of the semiconductor layer, depositing a capping insulating layer filling the second trench T2 having the semiconductor pattern 115, and forming the liner insulating pattern 113, the semiconductor pattern 115 and the capping insulating pattern 117 in the second trench T2 by planarizing the liner insulating layer and the capping insulating layer until a top surface of the first mask pattern MP1 is exposed.

For example, the liner insulating pattern 113 and the capping insulating pattern 117 may include silicon oxide, silicon nitride, and/or silicon oxynitride. The semiconductor pattern 115 may include poly-silicon doped with dopants, and/or undoped poly-silicon.

After the formation of the pixel isolation structure PIS, the first mask pattern MP1 may be removed, and the filling insulation layer 103 may be planarized to expose the first surface 100a of the semiconductor substrate 100, thereby forming a device isolation layer 105 in the first trench T1. By the planarization process exposing the first surface 100a of the semiconductor substrate 100, a top surface of the pixel isolation structure PIS may be substantially coplanar with a top surface of the device isolation layer 105.

Figure 8:
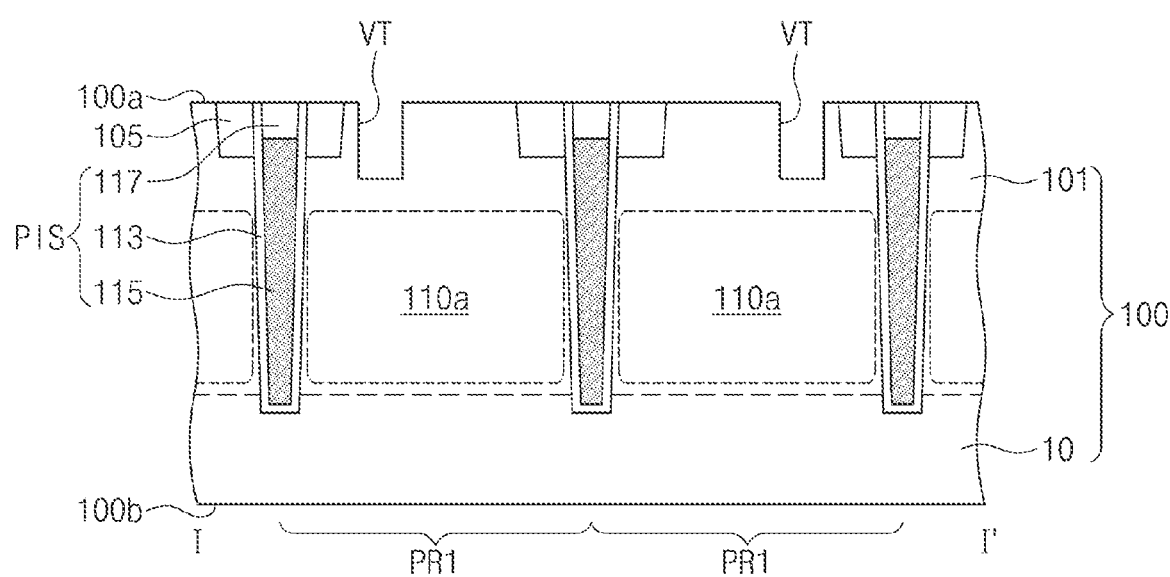

Referring to FIGS. 3 and 8, a vertical trench VT may be formed by patterning the first surface 100a of the semiconductor substrate 100 in each of the pixel regions PR1 and PR2.

The formation of the vertical trench VT may include forming a mask pattern on the first surface 100a of the semiconductor substrate 100, and anisotropically etching the semiconductor substrate 100 using the mask pattern as an etch mask by a predetermined depth.

A bottom surface of the vertical trench VT may be located at a lower level than a bottom surface of the device isolation layer 105. The bottom surface of the vertical trench VT may be vertically spaced apart from a top surface of the first dopant region 110a. In some embodiments, a depth of the vertical trench VT may be variously changed depending on a driving condition and characteristics of the image sensor. The vertical trench VT may have a substantially uniform width in an embodiment according to FIG. 13A, however embodiments of the inventive concept are not limited thereto. Alternatively, in some embodiments, the vertical trench VT may have an upper width and a lower width less than the upper width and may have an inclined sidewall.

Referring to FIGS. 3, 9A, 9B and 9C, a third mask pattern MP3 may be formed on the first surface 100a of the semiconductor substrate 100.

The third mask pattern MP3 may have an opening exposing a central portion of each of the pixel regions PR1 and PR2. The third mask pattern MP3 may overlap the pixel isolation structure PIS and a portion of the device isolation layer 105 when viewed in a plan view. In other words, the third mask pattern MP3 may include first portions extending in the first direction D1, and second portions intersecting the first portions and extending in the second direction D2.

A photoresist layer may be coated on the first surface 100a of the semiconductor substrate 100, and exposure and development processes may be performed on the photoresist layer to form the third mask pattern MP3. The photoresist layer may fill the vertical trench VT in the coating process of the photoresist layer, and a portion of the photoresist layer may remain in the vertical trench VT during the exposure and development processes. In other words, a residual mask pattern PR may be formed in the vertical trench VT when the third mask pattern MP3 is formed.

Figure 9A:
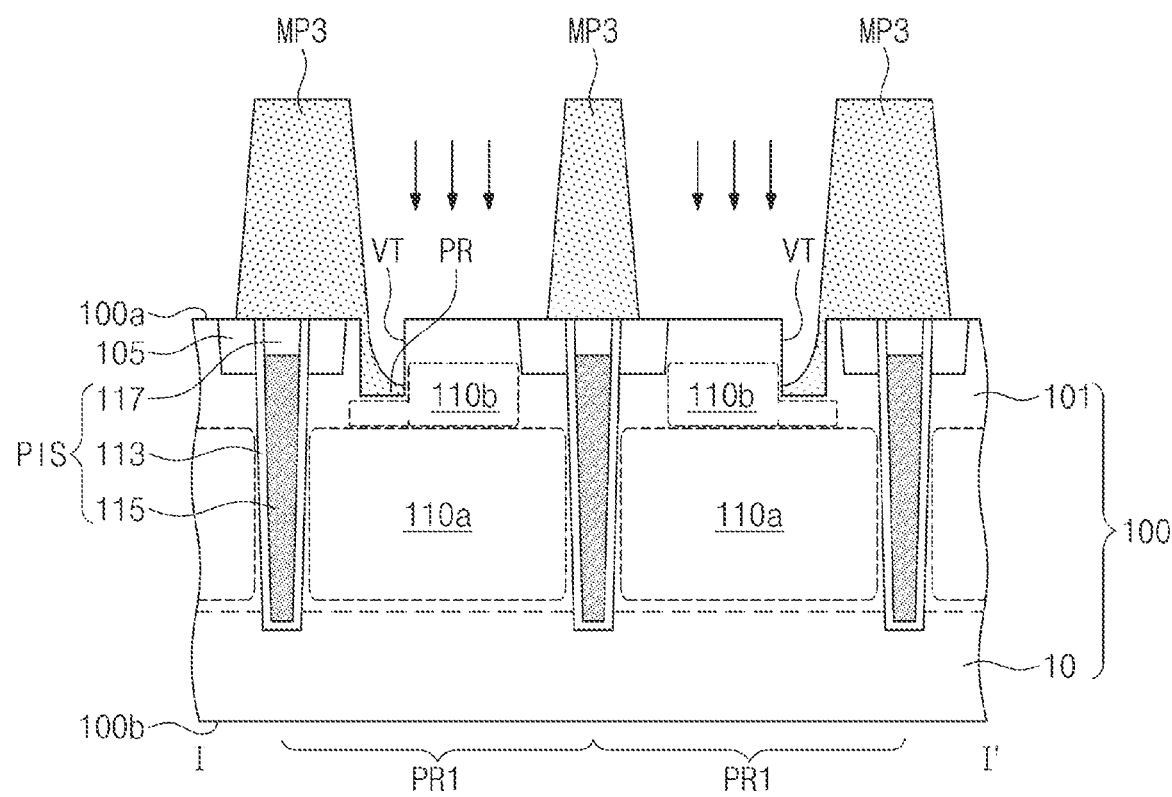

More particularly, referring to FIG. 9A, the residual mask pattern PR may fill a portion of the vertical trench VT and may have a non-uniform thickness on the bottom surface of the vertical trench VT. For example, the vertical trench VT may have a first sidewall adjacent to the third mask pattern MP3 and a second sidewall opposite to the first sidewall, and the thickness of the residual mask pattern PR may be greater at the first sidewall than at the second sidewall. Alternatively, the residual mask pattern PR may have a maximum thickness at the first and second sidewalls and may have a minimum thickness at a center of the vertical trench VT.

Figure 9B:
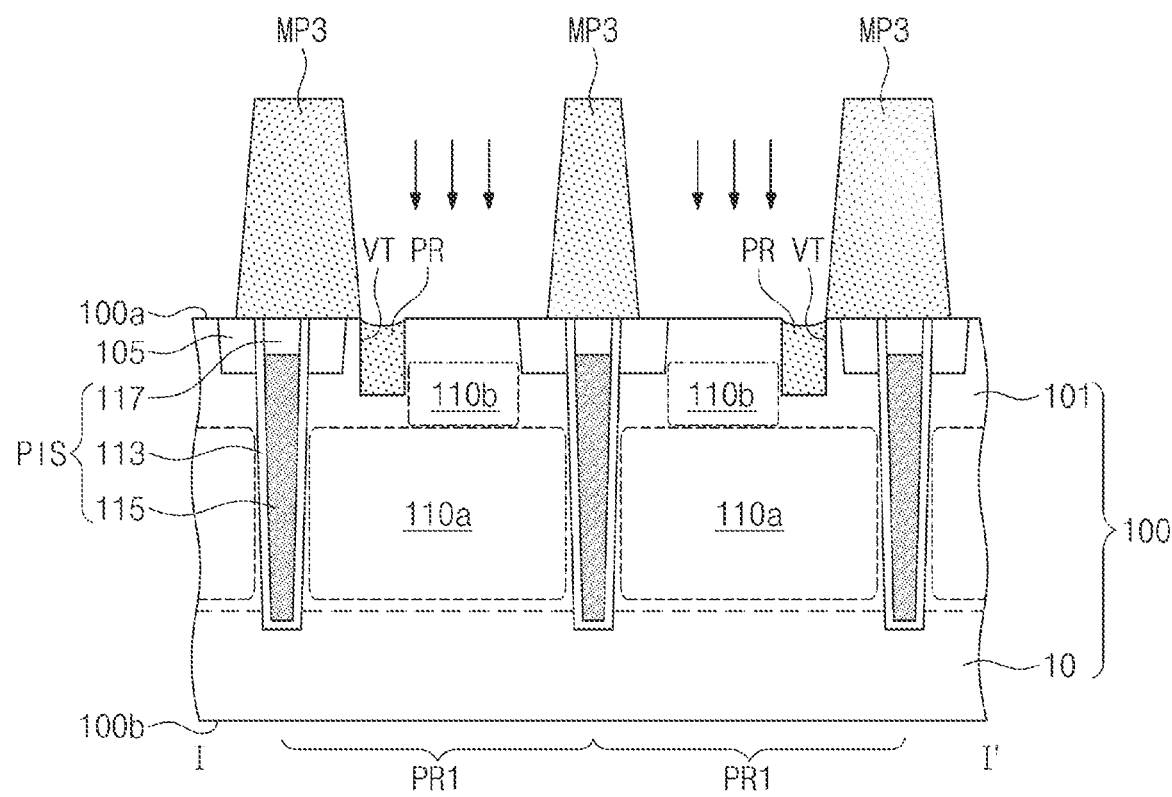

Referring to FIG. 9B, in some embodiments, the residual mask pattern PR may substantially fill the vertical trench VT. In some embodiments, the residual mask pattern PR may fill the majority of the vertical trench VT. In some embodiments, the residual mask pattern PR may completely fill the vertical trench VT (e.g., the residual mask pattern PR may fill an entirety of the vertical trench VT). In addition, a top surface of the residual mask pattern PR may be located at substantially the same level as the first surface 100a of the semiconductor substrate 100. In some embodiments, the residual mask pattern PR may have a rounded top surface or a downward concave top surface.

Figure 9C:
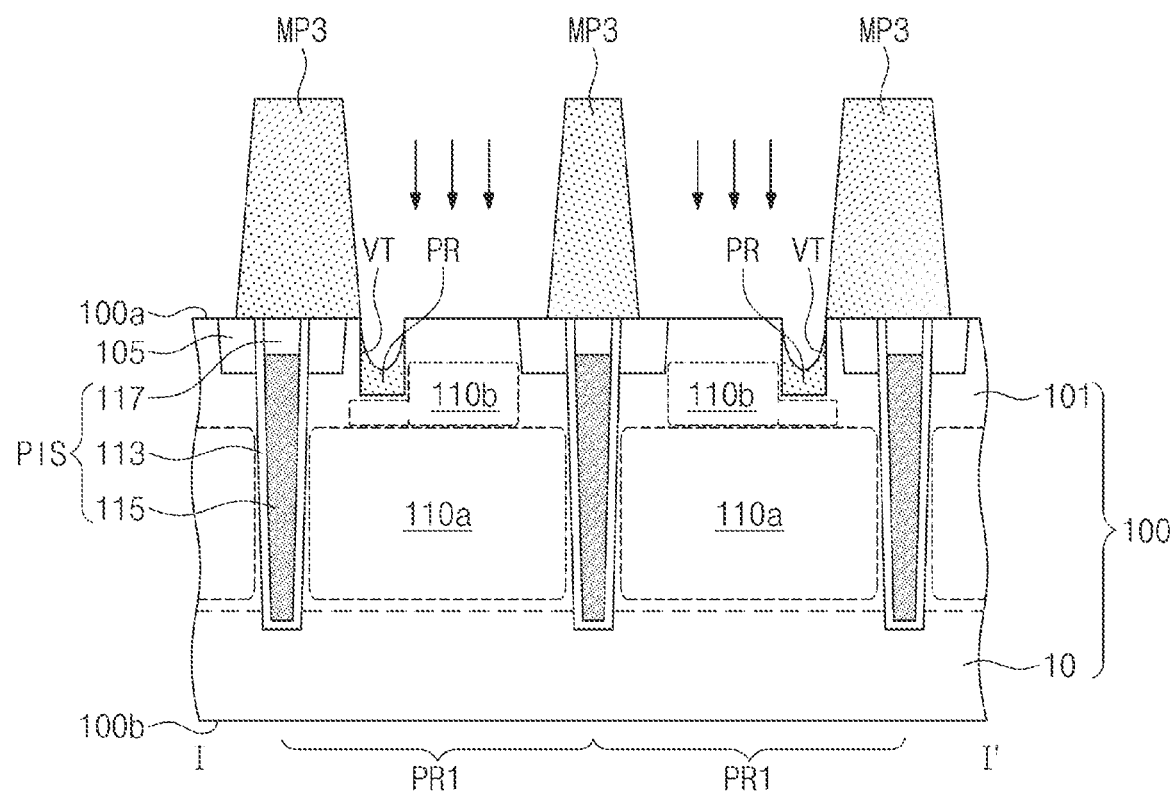

Referring to FIG. 9C, in some embodiments, the residual mask pattern PR may fill a portion of the vertical trench VT and may have a substantially uniform thickness. Alternatively, in some embodiments, the residual mask pattern PR may fill a portion of the vertical trench VT but may have a non-uniform thickness. In some embodiments, the residual mask pattern PR may have a thickness equal to about half of a depth of the vertical trench VT.

Subsequently, a second dopant region 110b may be formed in the epitaxial layer 101 of the semiconductor substrate 100 by using the third mask pattern MP3 and the residual mask pattern PR as ion implantation masks. The second dopant region 110b may be formed between the first surface 100a of the semiconductor substrate 100 and the first dopant region 110a. The second dopant region 110b may include dopants having the second conductivity type (e.g., the N-type) which is the same as that of the first dopant region 110a. A dopant doping concentration in the second dopant region 110b may be greater than a dopant doping concentration in the first dopant region 110a.

In the ion implantation process, the dopants having the second conductivity type may be implanted into the epitaxial layer 101 through the first surface 100a of the semiconductor substrate 100 and the residual mask pattern PR. Thus, the second dopant region 110b may be formed at a side of the vertical trench VT and under the vertical trench VT. In other words, as illustrated in FIGS. 9A and 9C, the second dopant region 110b may include a first region adjacent to one sidewall of the vertical trench VT, and a second region adjacent to the bottom surface of the vertical trench VT. Since the vertical trench VT is filled with the residual mask pattern PR in the ion implantation process, a vertical thickness of the second region of the second dopant region 110b may be less than a vertical thickness of the first region of the second dopant region 110b.

In some embodiments, when the residual mask pattern PR substantially and completely fills the vertical trench VT as illustrated in FIG. 9B, the dopants having the second conductivity type are not implanted under the bottom surface of the vertical trench VT.

According to some embodiments, since the ion implantation process is performed after the formation of the residual mask pattern PR, a doping depth of the dopants under the bottom surface of the vertical trench VT may be different from a doping depth of the dopants at a side of the vertical trench VT. The doping depth of the dopants under the vertical trench VT may be changed depending on the thickness of the residual mask pattern PR. In other words, the ion implantation process may be performed after the residual mask pattern PR is formed in the vertical trench VT, and thus, a vertical level difference between the first region and the second region of the second dopant region 110b may be reduced.

If the residual mask pattern PR in the vertical trench VT is omitted, a distance between the bottom surface of the vertical trench VT and the second region of the second dopant region 110b may be substantially equal to a distance between the first surface 100a of the semiconductor substrate 100 and the first region of the second dopant region 110b.

According to some embodiments, the residual mask pattern PR may be formed in the vertical trench VT, and thus, a distance between the bottom surface of the vertical trench VT and the second region of the second dopant region 110b may be different from a distance between the first surface 100a of the semiconductor substrate 100 and the first region of the second dopant region 110b. The distance between the bottom surface of the vertical trench VT and the second dopant region 110b may be less than the distance between the first surface 100a of the semiconductor substrate 100 and the second dopant region 110b. In addition, a depth (or the vertical thickness) of the second dopant region 110b under the bottom surface of the vertical trench VT may be less than a depth (or the vertical thickness) of the second dopant region 110b at a side of the vertical trench VT.

The third mask pattern MP3 and the residual mask pattern PR may be removed after the second dopant region 110b is formed, as described above.

Figure 10:
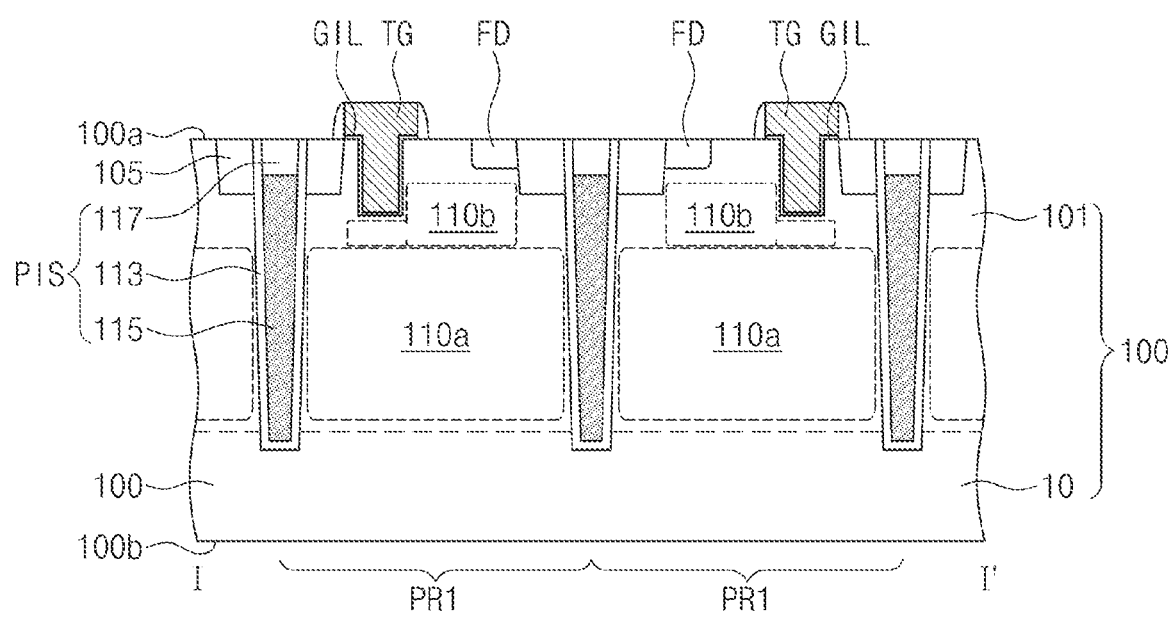

Next, referring to FIGS. 3 and 10, a gate insulating layer GIL and a transfer gate electrode TG may be formed in the vertical trench VT. The gate insulating layer GIL may include, for example, a silicon oxide layer, a silicon oxynitride layer, or a silicon nitride layer. The gate insulating layer GIL may be formed by a deposition process to conformally cover an inner surface of the vertical trench VT.

A gate conductive layer may be formed to fill the vertical trench VT having the gate insulating layer GIL, and then, the transfer gate electrode TG may be formed by patterning the gate conductive layer. When the transfer gate electrodes TG are formed, gate electrodes RG, SG and SFG of the logic transistors may also be formed on the second active portions ACT2 of the first and second pixel regions PR1 and PR2.

After the formation of the transfer gate electrodes TG, a floating diffusion region FD may be formed in the semiconductor substrate 100 at a side of each of the transfer gate electrodes TG. The floating diffusion regions FD may be formed by ion-implanting dopants having the second conductivity type. In addition, source/drain dopant regions of the logic transistors may be formed together when the floating diffusion regions FD are formed.

Figure 11:
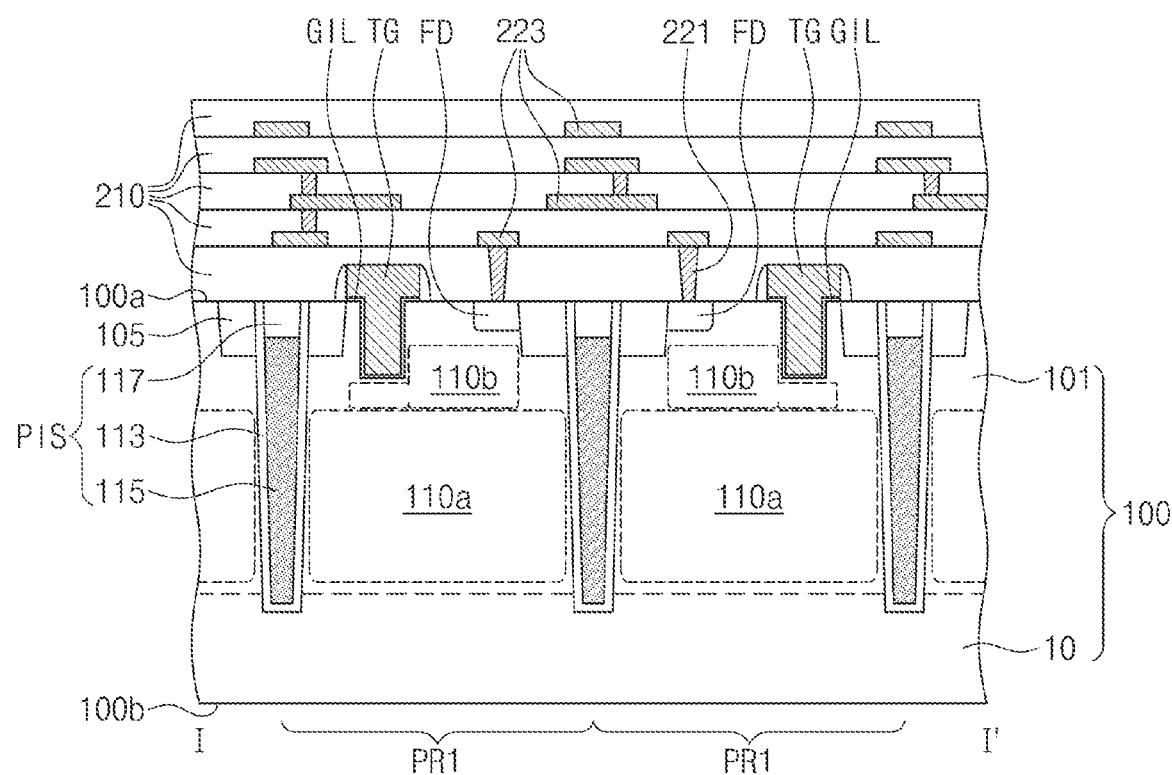

Subsequently, referring to FIG. 11, interlayer insulating layers 210, and an interconnection structure including contact plugs 221 and metal interconnection lines 223 may be formed on the first surface 100a of the semiconductor substrate 100. The contact plugs 221 may be connected to the metal interconnection lines 223. The interlayer insulating layers 210 may cover the transfer transistors and the logic transistors. The interlayer insulating layers 210 may be formed of a material having an excellent gap-fill property, and upper portions of the interlayer insulating layers 210 may be planarized.

The contact plugs 221 may be formed in the interlayer insulating layers 210 and may be connected to the floating diffusion regions FD and/or the transistors. The metal interconnection lines 223 may be formed between the interlayer insulating layers 210. For example, the contact plugs 221 and the metal interconnection lines 223 may be formed of at least one of copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or an alloy of a combination thereof.

Figure 12:
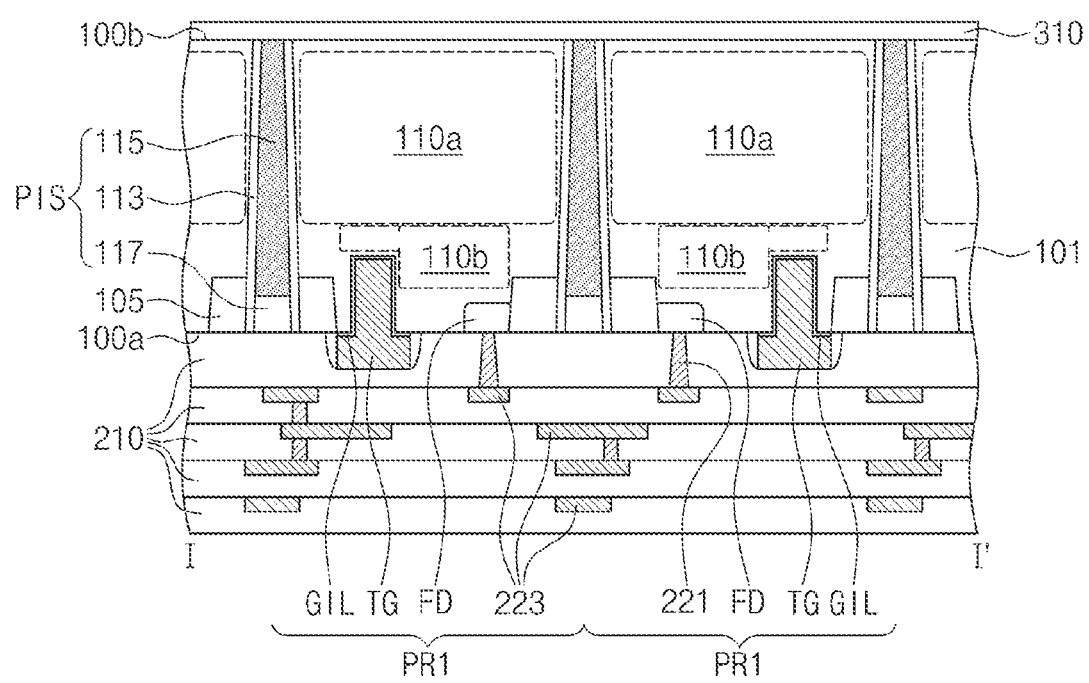

Referring to FIG. 12, a thinning process of removing a portion of the semiconductor substrate 100 may be performed to reduce a vertical thickness of the semiconductor substrate 100. The thinning process may include grinding or polishing the second surface 100b of the semiconductor substrate 100 and anisotropically and/or isotropically etching the second surface 100b of the semiconductor substrate 100. To thin the semiconductor substrate 100, the semiconductor substrate 100 may be turned over. By way of the grinding or polishing process, the bulk silicon substrate 10 of the semiconductor substrate 100 may be removed and the epitaxial layer 101 may be exposed. Subsequently, the anisotropic or isotropic etching process may be performed to remove surface defects existing on the exposed surface of the epitaxial layer 101.

The semiconductor pattern 115 of the pixel isolation structure PIS may be exposed at the second surface 100b of the semiconductor substrate 100 by way of the thinning process performed on the semiconductor substrate 100. A surface of the semiconductor pattern 115 and a surface of the liner insulating pattern 113 may be located at substantially the same level as the second surface 100b of the semiconductor substrate 100.

Next, a planarization insulating layer 310 may be formed on the second surface 100b of the semiconductor substrate 100. The planarization insulating layer 310 may cover the second surface 100b of the semiconductor substrate 100 and the surface of the semiconductor pattern 115. The planarization insulating layer 310 may be formed by depositing a metal oxide such as, for example, aluminum oxide and/or hafnium oxide.

Subsequently, referring to FIGS. 3 and 13A, a grid structure 320 may be formed on the planarization insulating layer 310. The grid structure 320 may include a light blocking pattern and/or a low-refractive index pattern. For example, the light blocking pattern may include a metal material such as titanium, tantalum, or tungsten. The low-refractive index pattern may be formed of a material having a refractive index lower than that of the light blocking pattern. The low-refractive index pattern may be formed of an organic material and may have a refractive index of about 1.1 to about 1.3. For example, the grid structure 320 may include a polymer layer including silica nanoparticles.

The grid structure 320 may extend in the first direction D1 and the second direction D2 and may have a grid shape. The grid structure 320 may overlap the semiconductor pattern 115 when viewed in a plan view.

A protective layer 330 may be formed on the planarization insulating layer 310 to cover a surface of the grid structure 320 with a substantially uniform thickness. For example, the protective layer 330 may include a single-layer or multi-layer including at least one of an aluminum oxide layer or a silicon oxycarbide layer.

Subsequently, color filters 340 respectively corresponding to the first and second pixel regions PR1 and PR2 may be formed on the protective layer 330. The color filters 340 may include, for example, blue, red and green color filters.

Next, micro lenses 350 may be formed on the color filters 340, respectively. Each of the micro lenses 350 may have a convex shape and may have a specific radius of curvature. The micro lenses 350 may be formed of a light transmitting resin.

A passivation layer 360 may conformally cover surfaces of the micro lenses 350. The passivation layer 360 may be formed of, for example, an inorganic oxide.

Hereinafter, an image sensor manufactured by the manufacturing method according to embodiments of the inventive concept will be described in detail.

Figure 13A:
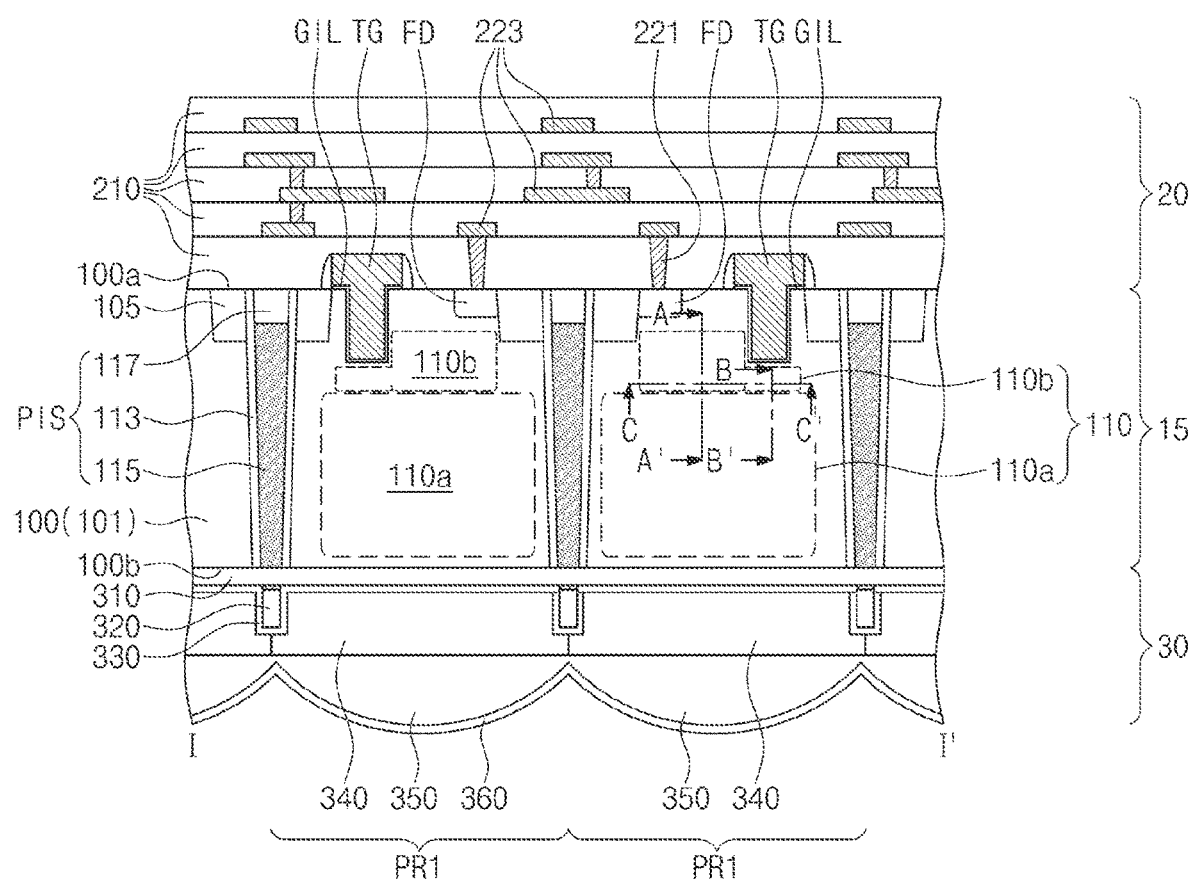
FIGS. 13A and 13B are cross-sectional views taken along line I-I' of FIG. 3 illustrating image sensors according to some embodiments of the inventive concept.
Figure 13B:
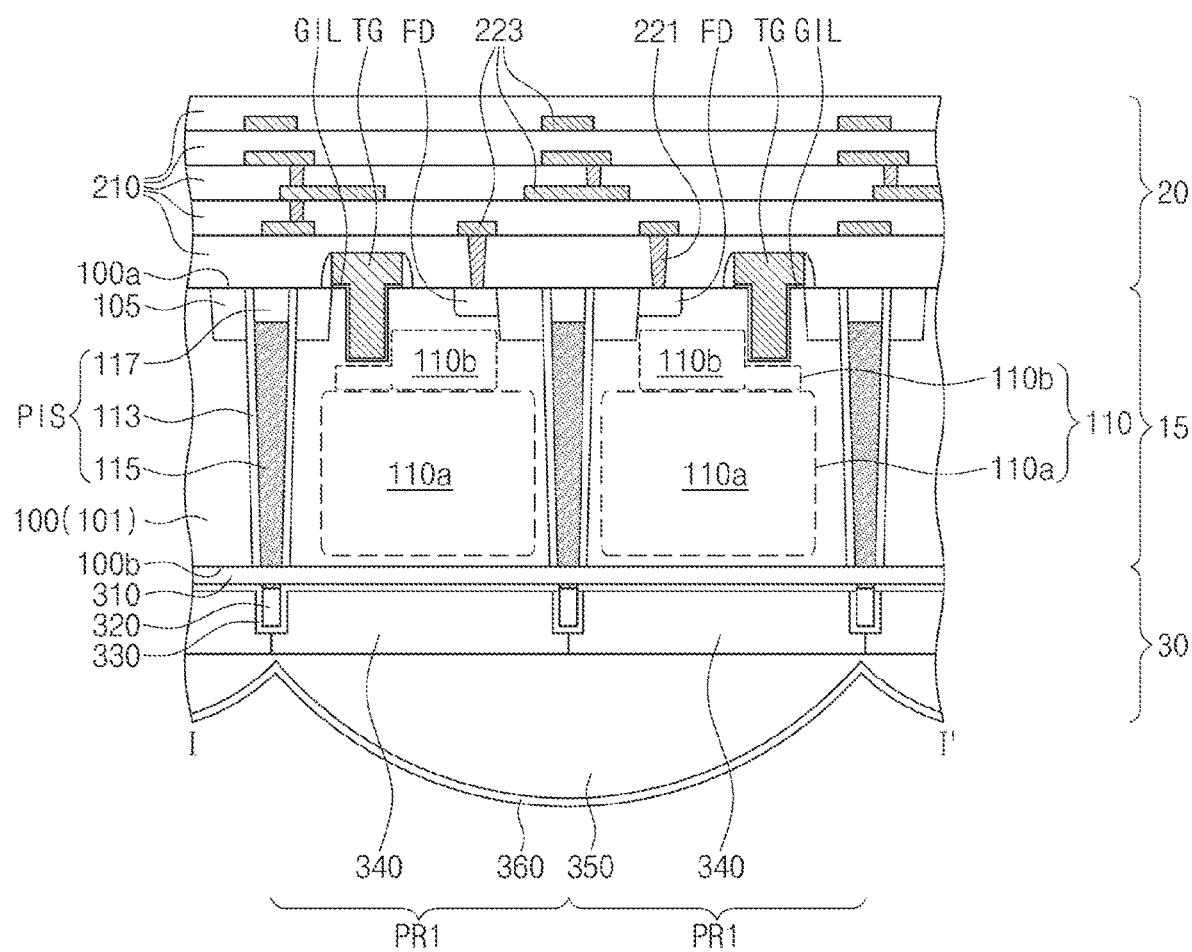
Figure 14A:
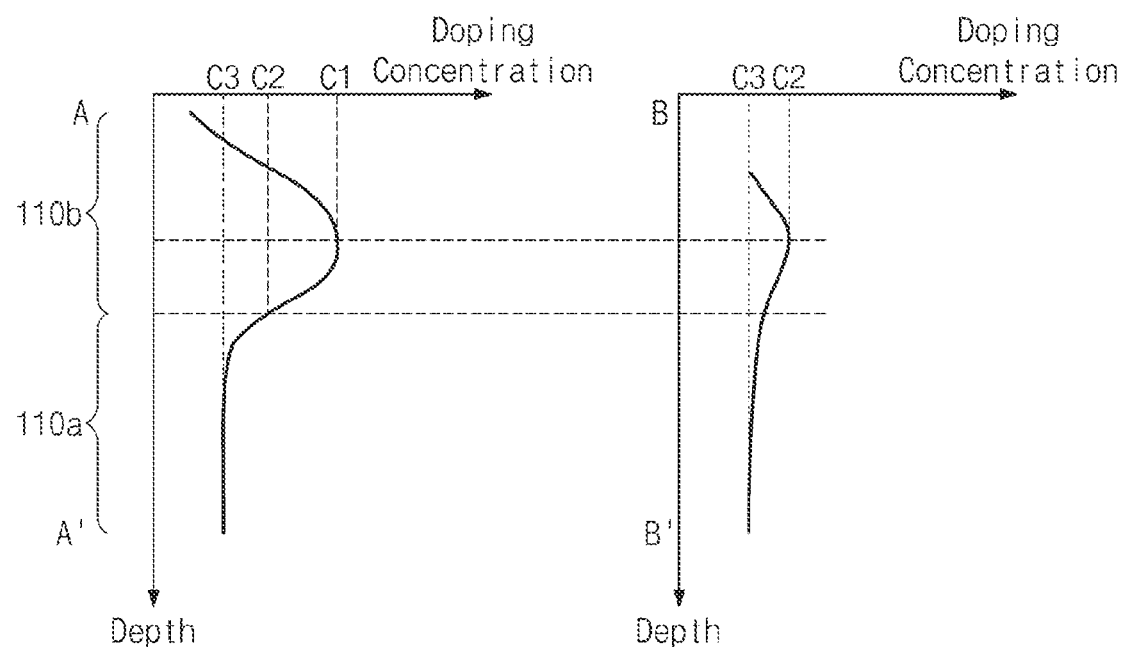
FIGS. 14A and 14B show doping profiles in some regions of an image sensor according to some embodiments of the inventive concept.
Figure 14B:
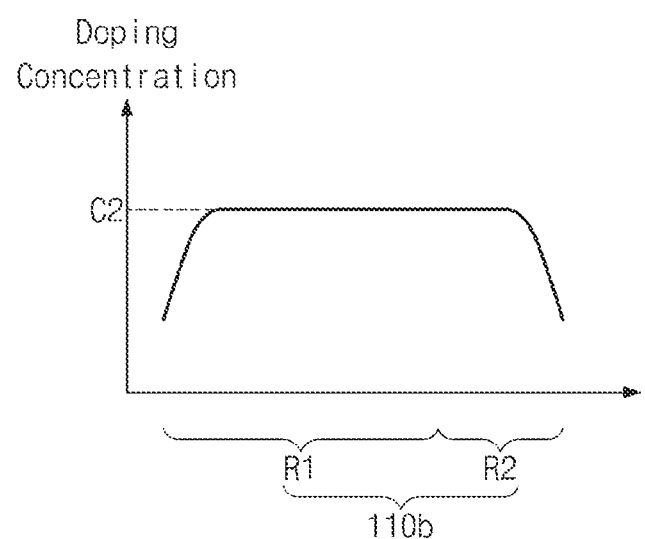

FIGS. 13A and 13B are cross-sectional views taken along line I-I' of FIG. 3 illustrating image sensors according to some embodiments of the inventive concept. FIGS. 14A and 14B show doping profiles in some regions of an image sensor according to some embodiments of the inventive concept.

Referring to FIGS. 3 and 13A, an image sensor according to some embodiments of the inventive concept may include a photoelectric conversion layer 15, a readout circuit layer 20, and a light transmitting layer 30. The photoelectric conversion layer 15 may be disposed between the readout circuit layer 20 and the light transmitting layer 30 when viewed in a cross-sectional view.

The photoelectric conversion layer 15 may include a semiconductor substrate 100 (e.g., an epitaxial layer 101 having a first conductivity type), a pixel isolation structure PIS defining first and second pixel regions PR1 and PR2, and photoelectric conversion regions 110 provided in the first and second pixel regions PR1 and PR2. Light incident from outside of the image sensor may be converted into electrical signals in the photoelectric conversion regions 110.

The readout circuit layer 20 may include readout circuits (e.g., MOS transistors including transfer and logic transistors) connected to the photoelectric conversion layer 15. Electrical signals converted in the photoelectric conversion layer 15 may be processed in the readout circuit layer 20.

The light transmitting layer 30 may include micro lenses 350 arranged in a matrix form and may include color filters 340 disposed between the semiconductor substrate 100 and the micro lenses 350. Each of the color filters 340 may include, for example, a red, green or blue color filter, depending on a corresponding pixel. Alternatively, some of the color filters 340 may include an infrared filter.

More particularly, the semiconductor substrate 100 (e.g., the epitaxial layer 101 having the first conductivity type)

may have a first surface (or a front surface) 100a and a second surface (or a back surface) 100b, which are opposite to each other.

The epitaxial layer 101 having the first conductivity type is described as the semiconductor substrate 100 in referring to an embodiment according to FIG. 13A. Alternatively, the semiconductor substrate 100 may be a bulk semiconductor substrate including a well having the first conductivity type.

The pixel isolation structure PIS may penetrate the semiconductor substrate 100 (e.g., the epitaxial layer 101). The pixel isolation structure PIS may extend from the first surface 100a to the second surface 100b of the epitaxial layer 101. A bottom surface of the pixel isolation structure PIS may be exposed at the second surface 100b of the epitaxial layer 101. The pixel isolation structure PIS may have a first upper width at the first surface 100a of the epitaxial layer 101 and may have a first lower width at the bottom surface thereof. The first lower width may be less than or substantially equal to the first upper width. A width of the pixel isolation structure PIS may become progressively less from the first surface 100a toward the second surface 100b of the epitaxial layer 101. For example, a width of the pixel isolation structure PIS may continuously decrease in a direction from the first surface 100a toward the second surface 100b of the epitaxial layer 101.

The pixel isolation structure PIS may define the pixel regions PR1 and PR2. The pixel isolation structure PIS may include first portions extending in the first direction D1 substantially parallel to each other, second portions intersecting the first portions and extending in the second direction D2 substantially parallel to each other, and intersection portions at which the first and second portions intersect each other.

The pixel isolation structure PIS may surround each of the pixel regions PR1 and PR2 when viewed in a plan view. The pixel regions PR1 and PR2 may be separated from each other in the first direction D1 and the second direction D2 by the pixel isolation structure PIS. In other words, the pixel regions PR1 and PR2 may be two-dimensionally arranged in the first direction D1 and the second direction D2.

The pixel isolation structure PIS may include a liner insulating pattern 113, a semiconductor pattern 115, and a capping insulating pattern 117. The semiconductor pattern 115 may vertically penetrate a portion of the epitaxial layer 101, and the liner insulating pattern 113 may be provided between the semiconductor pattern 115 and the epitaxial layer 101. The capping insulating pattern 117 may be disposed on the semiconductor pattern 115 and may have a top surface located at substantially the same level as a top surface of a device isolation layer 105. A bottom surface of the capping insulating pattern 117 may be located at substantially the same level as or a different level from a bottom surface of the device isolation layer 105. The bottom surface of the capping insulating pattern 117 may have a rounded shape. Each of the liner insulating pattern 113 and the capping insulating pattern 117 may include at least one of, for example, a silicon oxide layer, a silicon oxynitride layer, or a silicon nitride layer. The semiconductor pattern 115 may include, for example, an undoped poly-silicon layer or a poly-silicon layer doped with dopants. The semiconductor pattern 115 may include an air gap or a void.

The device isolation layer 105 may define first and second active portions ACT1 and ACT2 at the first surface 100a of the epitaxial layer 101 in each of the first and second pixel regions PR1 and PR2. The first and second active portions ACT1 and ACT2 may be spaced apart from each other in each of the first and second pixel regions PR1 and PR2 and may have different sizes.

A transfer gate electrode TG may be disposed on the first active portion ACT1 of each of the first and second pixel regions PR1 and PR2.

The transfer gate electrode TG may be provided in a vertical trench formed in the first surface 100a of the epitaxial layer 101. The transfer gate electrode TG may include a lower portion inserted in the epitaxial layer 101 (e.g., the vertical trench) and an upper portion protruding above the first surface 100a of the epitaxial layer 101. The upper portion of the transfer gate electrode TG may be connected to the lower portion of the transfer gate electrode TG. The lower portion of the transfer gate electrode TG may penetrate a portion of the epitaxial layer 101. A bottom surface of the transfer gate electrode TG may be located at a lower level than the first surface 100a of the epitaxial layer 101. The bottom surface of the transfer gate electrode TG may be located at a lower level than the bottom surface of the device isolation layer 105. In other words, the bottom surface of the device isolation layer 105 may be closer to the first surface 100a of the epitaxial layer 101 than the bottom surface of the transfer gate electrode TG.

A gate insulating layer GIL may be disposed between the transfer gate electrode TG and the epitaxial layer 101.

A floating diffusion region FD may be provided in the first active portion ACT1 at a side of the transfer gate electrode TG. The floating diffusion region FD may be a dopant region having a conductivity type opposite to that of the epitaxial layer 101.

The photoelectric conversion region 110 may be provided in the epitaxial layer 101 of each of the pixel regions PR1 and PR2. The photoelectric conversion region 110 may generate photocharges in proportion to the intensity of incident light. The photoelectric conversion region 110 may include dopants having a second conductivity type opposite to that of the epitaxial layer 101. Photodiodes may be formed by junction of the epitaxial layer 101 having the first conductivity type and the photoelectric conversion regions 110 having the second conductivity type. Light incident through the second surface 100b of the epitaxial layer 101 may generate charges in the photoelectric conversion region 110.

In some embodiments, the photoelectric conversion region 110 may include a first dopant region 110a and a second dopant region 110b. The first and second dopant regions 110a and 110b may include dopants having the second conductivity type. The first dopant region 110a may be adjacent to the second surface 100b of the epitaxial layer 101, and the second dopant region 110b may be adjacent to the first surface 100a of the epitaxial layer 101. For example, the first dopant region 110a may be disposed closer to the second surface 100b than it is disposed to the first surface 100a, and the second dopant region 110b may be disposed closer to the first surface 100a than it is disposed to the second surface 100b. A dopant concentration may be greater in the second dopant region 110b than in the first dopant region 110a.

A width of the second dopant region 110b may be less than a width of the first dopant region 110a. For example, a width of the first dopant region 110a in one direction may be greater than a width of the second dopant region 110b in the one direction. The first dopant region 110a may overlap the transfer gate electrode TG and a portion of the device isolation layer 105.

The second dopant region 110b may be provided around the transfer gate electrode TG. In some embodiments, the second dopant region 110b does not overlap the device isolation layer 105.

More particularly, the second dopant region 110b may include a first region adjacent to a sidewall of the transfer gate electrode TG, and a second region adjacent to the bottom surface of the transfer gate electrode TG. A vertical thickness of the second region of the second dopant region 110b may be less than a vertical thickness of the first region of the second dopant region 110b.

A distance between the bottom surface of the transfer gate electrode TG and the second region of the second dopant region 110b may be different from a distance between the first surface 100a of the epitaxial layer 101 and the first region of the second dopant region 110b.

FIG. 14A shows doping profiles taken along lines A-A' and B-B' of FIG. 13A according to some embodiments of the inventive concept. Referring to FIG. 14A, a dopant concentration (or a doping concentration) in the second dopant region 110b may have a maximum value C1 in the first region of the second dopant region 110b. A maximum concentration C2 of the dopants in the second region of the second dopant region 110b may be less than the maximum value C1.

At the same distance from the first surface 100a of the epitaxial layer 101, the dopant concentration of the first region of the second dopant region 110b may be substantially equal to the dopant concentration of the second region of the second dopant region 110b. The second dopant region 110b may have substantially the same doping profile at a side of the transfer gate electrode TG and under the bottom surface of the transfer gate electrode TG. In some embodiments, a concentration of the dopants having the second conductivity type may be substantially uniform in the first region of the second dopant region 110b and the second region of the second dopant region 110b at about the same distance from the first surface 100a of the semiconductor substrate 100.

A dopant concentration C3 in the first dopant region 110a may be less than the dopant concentration in the second dopant region 110b.

FIG. 14B shows a doping profile taken along line C-C' of FIG. 13A according to some embodiments of the inventive concept. As described above, the second dopant region 110b may include the first region (R1) located at a side of the transfer gate electrode TG and the second region (R2) adjacent to the bottom surface of the transfer gate electrode TG. As illustrated in FIG. 14B, the second dopant region 110b may have a substantially continuous and uniform doping concentration in the first region (R1) and the second region (R2). In other words, referring to FIG. 14B, the second dopant region 110b may have a continuous doping profile at a side of the transfer gate electrode TG and under the bottom surface of the transfer gate electrode TG. That is, according to some embodiments, a sharp difference in dopant concentration does not occur between the first region (R1) and the second region (R2) of the second dopant region 110b.

According to some embodiments, the second dopant region 110b may have the continuous doping profile at a side of the transfer gate electrode TG and under the bottom surface of the transfer gate electrode TG, and thus, a phenomenon in which a current flow is interrupted by an abrupt change of a dopant concentration of the second dopant region 110b around the vertical trench VT when a turn-on voltage is applied to the transfer gate electrode TG may be prevented according to embodiments of the inventive concept. As a result, a loss of charges generated in the photoelectric conversion region 110 may be reduced, and thus, electrical characteristics of the image sensor may be improved according to embodiments of the inventive concept.

Referring again to FIGS. 3 and 13A, a reset gate electrode RG and a selection gate electrode SG may be disposed on the second active portion ACT2 of the first pixel region PR1, and a source follower gate electrode SFG may be disposed on the second active portion ACT2 of the second pixel region PR2.

A second gate insulating layer may be disposed between the epitaxial layer 101 and the reset and selection gate electrodes RG and SG, and a third gate insulating layer may be disposed between the epitaxial layer 101 and the source follower gate electrode SFG.

Source/drain dopant regions may be provided in the second active portion ACT2 at both sides of each of the reset, selection and source follower gate electrodes RG, SG and SFG. Contact plugs may be connected to the source/drain dopant regions.

Interlayer insulating layers 210 may be stacked on the first surface 100a of the epitaxial layer 101. The interlayer insulating layers 210 may cover the MOS transistors (e.g., the gate electrodes TG, RG, SG and SFG) of the readout circuits. For example, the interlayer insulating layers 210 may include at least one of silicon oxide, silicon nitride, or silicon oxynitride.

An interconnection structure including contact plugs 221 and metal interconnection lines 223 connected to the readout circuits may be disposed in the interlayer insulating layers 210. The contact plugs 221 may be connected to the metal interconnection lines 223.

The light transmitting layer 30 may be disposed on the second surface 100b of the semiconductor substrate 100. The light transmitting layer 30 may include a planarization insulating layer 310, a grid structure 320, a protective layer 330, color filters 340, micro lenses 350, and a passivation layer 360.

The planarization insulating layer 310 may include a plurality of planarization layers having different refractive indexes, and the planarization layers may be formed of transparent insulating materials. The planarization layers with appropriate thicknesses may be combined with each other, and thus, the planarization insulating layer 310 may have a high transmittance.

The grid structure 320 may be disposed on the planarization insulating layer 310. Like the pixel isolation structure PIS, the grid structure 320 may have a grid shape when viewed in a plan view. The grid structure 320 may overlap the pixel isolation structure PIS when viewed in a plan view. In other words, the grid structure 320 may include first portions extending in the first direction D1, and second portions extending in the second direction D2 to intersect the first portions. A width of the grid structure 320 may be substantially equal to or less than a minimum width of the pixel isolation structure PIS.

The grid structure 320 may include a light blocking pattern and/or a low-refractive index pattern. For example, the light blocking pattern may include a metal material such as titanium, tantalum, or tungsten. The low-refractive index pattern may be formed of a material having a refractive index lower than that of the light blocking pattern. The low-refractive index pattern may be formed of an organic material and may have a refractive index of about 1.1 to about 1.3. For example, the grid structure 320 may include a polymer layer including silica nanoparticles.

The protective layer 330 may be provided on the planarization insulating layer 310 to cover a surface of the grid structure 320 with a substantially uniform thickness. For example, the protective layer 330 may include a single-layer or multi-layer including at least one of an aluminum oxide layer or a silicon oxycarbide layer.

The color filters 340 may be formed to correspond to the first and second pixel regions PR1 and PR2, respectively. The color filters 340 may fill spaces defined by the grid structure 320, respectively. Each of the color filters 340 may include, for example, a red, green or blue color filter, or may include, for example, a magenta, cyan or yellow color filter.

Referring to FIG. 13A, the micro lenses 350 may be provided on the color filters 340 to correspond to the first and second pixel regions PR1 and PR2, respectively. Alternatively, referring to FIG. 13B, each of the micro lenses 350 may be provided to correspond to a plurality of the first and second pixel regions PR1 and PR2. For example, each of the micro lenses 350 may be provided in common on four pixel regions PR1 and PR2.

Figure 15:
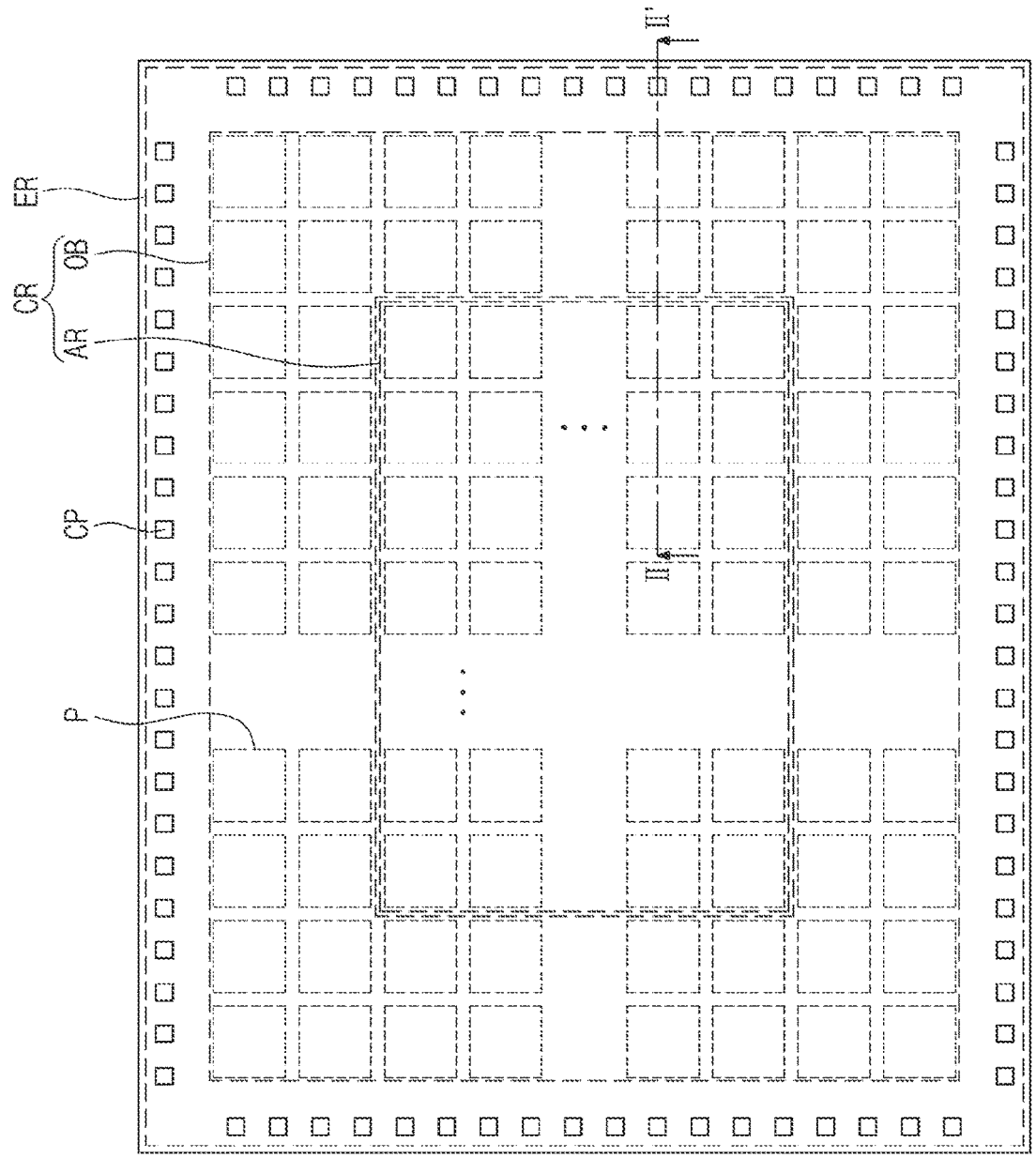
FIG. 15 is a plan view schematically illustrating an image sensor according to some embodiments of the inventive concept.
Figure 16:
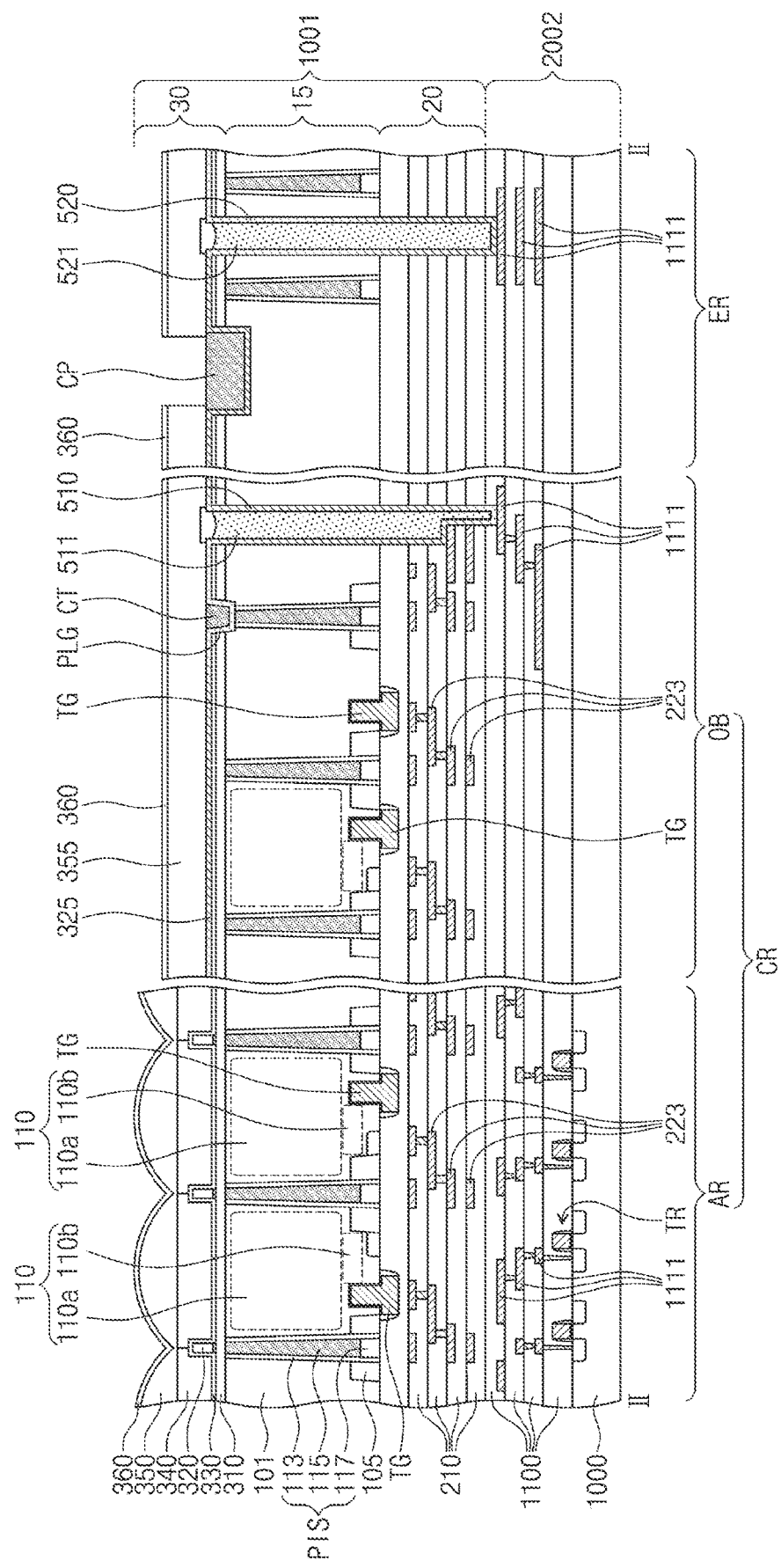
FIG. 16 is a cross-sectional view taken along line II-II' of FIG. 15 according to some embodiments of the inventive concept.

FIG. 15 is a plan view schematically illustrating an image sensor according to some embodiments of the inventive concept. FIG. 16 is a cross-sectional view taken along line II-II' of FIG. 15 according to some embodiments of the inventive concept.

Referring to FIGS. 15 and 16, an image sensor may include a sensor chip 1001 and a logic chip 2001. The sensor chip 1001 may include a pixel array region CR and a pad region ER.

The pixel array region CR may include a plurality of unit pixels P two-dimensionally arranged in first and second directions D1 and D2 intersecting each other. Each of the unit pixels P may include a photoelectric conversion element and readout elements (e.g., transfer and logic transistors). An electrical signal generated by incident light may be outputted from each of the unit pixels P of the pixel array region CR.

The pixel array region CR may include a light receiving region AR and a light blocking region OB. The light blocking region OB may surround the light receiving region AR when viewed in a plan view. In other words, the light blocking region OB may be disposed at top, bottom, left and right sides of the light receiving region AR when viewed in a plan view. Reference pixels to which light is not incident may be provided in the light blocking region OB. Charge amounts sensed from the unit pixels of the light receiving region AR may be compared with reference charge amounts generated by the reference pixels, thereby calculating magnitudes of electrical signals sensed from the unit pixels.

A plurality of conductive pads CP used to input/output control signals and photoelectric signals may be disposed in the pad region ER. The pad region ER may surround the pixel array region CR in a plan view, and thus, the pad region ER may be efficiently connected to external devices. The conductive pads CP may output electrical signals generated by the unit pixels P to an external device.

The sensor chip 1001 may include the readout circuit layer 20, the light transmitting layer 30, and the photoelectric conversion layer 15 disposed between the readout circuit layer 20 and the light transmitting layer 30, as described above.

The photoelectric conversion layer 15 of the sensor chip 1001 may include the epitaxial layer 101, the pixel isolation structure PIS defining the pixel regions PR1 and PR2, and the photoelectric conversion regions 110 provided in the pixel regions PR1 and PR2, as described above. The epitaxial layer 101 may correspond to the epitaxial layer described in above.

The sensor chip 1001 in the light receiving region AR may have the same technical features as the image sensor described above.

In the light blocking region OB, a portion of the pixel isolation structure PIS may be connected to a contact plug PLG. A contact pad CT may be disposed on the contact plug PLG, and the contact pad CT may be provided on the second surface 100b of the epitaxial layer 101 in the light blocking region OB. The contact pad CT may include aluminum. The contact plug PLG may penetrate a portion of the epitaxial layer 101.

The planarization insulating layer 310 may extend from the light receiving region AR into the light blocking region OB and the pad region ER. A light blocking pattern 325 may be disposed on the planarization insulating layer 310 in the light blocking region OB. The light blocking pattern 325 may prevent light from being incident into the photoelectric conversion regions 110 provided in the light blocking region OB.

In the light blocking region OB, a first through-conductive pattern 510 may penetrate the epitaxial layer 101 so as to be electrically connected to the metal interconnection line 223 of the readout circuit layer 20 and an interconnection structure 1111 of the logic chip 2001. The first through-conductive pattern 510 may have a first bottom surface and a second bottom surface, which are located at different levels. A first filling pattern 511 may be provided in an inner space surrounded by the first through-conductive pattern 510. The first filling pattern 511 may include a low-refractive index material and may have an insulating property.

In the pad region ER, the conductive pads CP may be provided at the second surface 100b of the epitaxial layer 101. The conductive pads CP may include a metal such as, for example, aluminum, copper, tungsten, titanium, tantalum, or any alloy thereof. In a mounting process of the image sensor, bonding wires may be bonded to the conductive pads CP. The conductive pads CP may be electrically connected to an external device through the bonding wires.

In the pad region ER, the pixel isolation structure PIS may be provided around the conductive pads CP.

In the pad region ER, a second through-conductive pattern 520 may penetrate the epitaxial layer 101 so as to be electrically connected to the interconnection structure 1111 of the logic chip 2001. The second through-conductive pattern 520 may extend onto the second surface 100b of the epitaxial layer 101 so as to be electrically connected to the conductive pad CP. A portion of the second through-conductive pattern 520 may cover a bottom surface and a sidewall of the conductive pad CP. A second filling pattern 521 may be provided in an inner space surrounded by the second through-conductive pattern 520. The second filling pattern 521 may include a low-refractive index material and may have an insulating property.

An organic layer 355 may be disposed in the light blocking region OB and the pad region ER. The organic layer 355 may cover the light blocking pattern 325, the contact pad CT, and the conductive pads CP.

The logic chip 2001 may include a logic semiconductor substrate 1000, logic circuits TR, interconnection structures 1111 connected to the logic circuits TR, and logic interlayer insulating layers 1100. An uppermost one of the logic interlayer insulating layers 1100 may be bonded to the readout circuit layer 20 of the sensor chip 1001. The logic chip 2001 may be electrically connected to the sensor chip 1001 through the first through-conductive pattern 510 and the second through-conductive pattern 520.

In the above-described embodiments, the sensor chip 1001 and the logic chip 2001 may be electrically connected to each other through the first and second through-conductive patterns 510 and 520. However, embodiments of the inventive concept are not limited thereto. For example, in some embodiments, bonding pads of a lowermost metal layer of the sensor chip may be bonded directly to bonding pads of an uppermost metal layer of the logic chip, and thus, the sensor chip and the logic chip may be electrically connected to each other.

According to embodiments of the inventive concept, the continuous doping profile may be provided at a side of the transfer gate electrode and under the bottom surface of the transfer gate electrode. Thus, a phenomenon in which a current flow is interrupted by an abrupt change of a dopant concentration of the second dopant region around the transfer gate electrode when a turn-on voltage is applied to the transfer gate electrode may be prevented according to embodiments of the inventive concept. As a result, a loss of charges generated by the photoelectric conversion layer may be reduced, and thus, the electrical characteristics of the image sensor may be improved.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. A method of manufacturing an image sensor, the method comprising:
    forming a first dopant region having a second conductivity type in a semiconductor substrate,
    wherein the semiconductor substrate comprises a first surface and a second surface opposite to the first surface, and the semiconductor substrate has a first conductivity type different from the second conductivity type;
    forming a pixel isolation structure defining a plurality of pixel regions in the semiconductor substrate;
    forming a vertical trench by patterning the first surface of the semiconductor substrate in each of the pixel regions;
    forming a mask pattern exposing each of the pixel regions on the first surface of the semiconductor substrate, wherein the mask pattern comprises a residual mask pattern filling at least a portion of the vertical trench;
    forming a second dopant region by ion-implanting dopants having the second conductivity type into the semiconductor substrate by using the mask pattern as an ion-implantation mask, wherein the second dopant region is adjacent to the vertical trench; and
    forming a transfer gate electrode in the vertical trench, wherein a gate insulating layer is interposed between the transfer gate electrode and an inner surface of the vertical trench.

2. The method of claim 1, wherein the second dopant region comprises:
    a first region adjacent to a sidewall of the vertical trench; and
    a second region adjacent to a bottom surface of the vertical trench,
    wherein an ion-implantation depth of the dopants in the second region is different from an ion-implantation depth of the dopants in the first region.

3. The method of claim 1, wherein the residual mask pattern completely fills the vertical trench.

4. The method of claim 1, wherein the residual mask pattern has a thickness equal to a half of a depth of the vertical trench.

5. The method of claim 1, wherein the residual mask pattern has a non-uniform thickness in the vertical trench.

6. The method of claim 1, wherein the second dopant region comprises:
    a first region adjacent to a sidewall of the vertical trench; and
    a second region adjacent to a bottom surface of the vertical trench,
    wherein a concentration of the dopants having the second conductivity type has a maximum value in the first region of the second dopant region.

7. The method of claim 1, wherein the second dopant region comprises:
    a first region adjacent to a sidewall of the vertical trench; and
    a second region adjacent to a bottom surface of the vertical trench,
    wherein a concentration of the dopants having the second conductivity type is uniform in the first region and the second region at a same distance from the first surface of the semiconductor substrate.

8. The method of claim 1, wherein the second dopant region comprises:
    a first region adjacent to a sidewall of the vertical trench; and
    a second region adjacent to a bottom surface of the vertical trench,
    wherein a distance between a bottom surface of the transfer gate electrode and the second region is less than a distance between the first surface of the semiconductor substrate and the first region.

9. The method of claim 1, further comprising:
    forming a device isolation layer adjacent to the first surface in the semiconductor substrate before forming the vertical trench,
    wherein a bottom surface of the device isolation layer is closer to the first surface of the semiconductor substrate than a bottom surface of the vertical trench.

10. The method of claim 9, wherein the first dopant region overlaps the device isolation layer and the transfer gate electrode.

11. The method of claim 1, wherein a width of the second dopant region is less than a width of the first dopant region.

12. The method of claim 1, wherein a concentration of the dopants having the second conductivity type is greater in the second dopant region than in the first dopant region.

* * * * *